United States Patent
Issakov et al.

(10) Patent No.: US 10,498,290 B2
(45) Date of Patent: Dec. 3, 2019

(54) SYSTEM AND METHOD FOR A VCO

(71) Applicant: Infineon Technologies AG, Neubiberg (DE)

(72) Inventors: Vadim Issakov, Munich (DE); Fabio Padovan, Villach (AT); Dmytro Cherniak, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 12 days.

(21) Appl. No.: 15/820,029

(22) Filed: Nov. 21, 2017

(65) Prior Publication Data
US 2019/0158022 A1 May 23, 2019

(51) Int. Cl.
| | | |
|---|---|---|
| H03B 5/12 | (2006.01) | |
| G01S 7/03 | (2006.01) | |
| G01S 13/56 | (2006.01) | |

(52) U.S. Cl.
CPC .............. *H03B 5/1293* (2013.01); *G01S 7/03* (2013.01); *H03B 5/1212* (2013.01); *H03B 5/1215* (2013.01); *H03B 5/1228* (2013.01); *H03B 5/1243* (2013.01); *H03B 5/1296* (2013.01); *G01S 7/032* (2013.01); *G01S 13/56* (2013.01); *H03B 2200/009* (2013.01); *H03B 2200/0038* (2013.01); *H03B 2200/0054* (2013.01)

(58) Field of Classification Search
CPC ..................................................... H03B 5/1293
USPC ............................................................ 331/16
See application file for complete search history.

(56) References Cited

U.S. PATENT DOCUMENTS

| | | | |
|---|---|---|---|
| 7,688,153 B2 | 3/2010 | Jacobsson et al. | |
| 9,490,745 B1 | 11/2016 | Toso et al. | |
| 2003/0227336 A1 | 12/2003 | Wang et al. | |
| 2007/0182502 A1 | 8/2007 | Shin et al. | |
| 2008/0164955 A1* | 7/2008 | Pfeiffer | ................ H03B 5/1231 331/117 R |
| 2008/0266005 A1* | 10/2008 | Jacobsson | ................ H03J 3/32 331/108 A |
| 2010/0277207 A1 | 11/2010 | Mandavi | |
| 2013/0135057 A1 | 5/2013 | Roithmeier | |
| 2017/0047890 A1 | 2/2017 | Lin et al. | |

FOREIGN PATENT DOCUMENTS

WO 201542814 A1 4/2015

OTHER PUBLICATIONS

Ahmadi-Mehr, Seyed, et al., "Analysis and Design of a Multi-Core Oscillator for Ultra-Low Phase Noise," IEEE Transactions on Circuits and Systems I: Regular Papers 63.4, Mar. 2016: 11 pages.
(Continued)

*Primary Examiner* — Joseph Chang
(74) *Attorney, Agent, or Firm* — Slater Matsil, LLP

(57) ABSTRACT

In accordance with an embodiment, a method of operating a voltage controlled oscillator (VCO) that having a VCO core coupled to a filtered current source includes setting an oscillation frequency of the VCO core based on a tuning signal received at a tuning signal input; and setting a resonant frequency of the filtered current source based on the received tuning signal using a tuning circuit having an input directly connected to the tuning signal input.

20 Claims, 17 Drawing Sheets

(56) References Cited

OTHER PUBLICATIONS

Garampazzi, Marco, et al. "Analysis and Design of a 195.6 dBc/Hz Peak FoM P-N Class-B Oscillator With Transformer-Based Tail Filtering," IEEE Journal of Solid-State Circuits, 50.7, Jul. 2015, 12 pages.

Hegazi, Emad, et al., "A 17-mW Transmitter and Frequency Synthesizer for 900-MHz GSM Fully Integrated in 0.35-/spl u/m CMOS," IEEE Journal of Solid-State Circuits 38.5, Apr. 2003, 11 pages.

Hegazi, Emad et al., "A Filtering Technique to Lower IC Oscillator Phase Noise," IEEE Journal of Solid-State Circuits, vol. 36, No. 12, Dec. 2001, pp. 1921-1930.

\* cited by examiner

SYSTEM AND METHOD FOR A VCO

TECHNICAL FIELD

The present invention relates generally to an electronic device, and, in particular embodiments, to a system and method for a VCO.

BACKGROUND

Applications in the millimeter-wave frequency regime have gained significant interest in the past few years due to the rapid advancement in low-cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy, and sensitivity of the radar system may depend, in part, on the phase noise performance and frequency agility of the radar's frequency generation circuitry, which generally includes an RF oscillator and circuitry that controls the frequency of the RF oscillator.

As the operating frequencies of RF systems continue to increase, however, the generation of signals at such high frequencies poses a major challenge. Oscillators that operate at high frequencies may suffer from a poor phase noise performance that caused by 1/f and thermal noise in the devices that comprise the VCO.

SUMMARY

In accordance with an embodiment, a method of operating a voltage controlled oscillator (VCO) that having a VCO core coupled to a filtered current source includes setting an oscillation frequency of the VCO core based on a tuning signal received at a tuning signal input; and setting a resonant frequency of the filtered current source based on the received tuning signal using a tuning circuit having an input directly connected to the tuning signal input.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to preferred embodiments in a specific context, a system and method for a voltage controlled oscillator. The invention may be applied to various systems that utilize voltage controlled oscillators including radar systems, such as gesture recognition and automotive radar systems, wireless communication systems, and other types of RF systems.

In embodiments of the present invention, the phase noise of a RF VCO is reduced by tuning a resonant filter of a bias circuit of the VCO to the second harmonic of the VCO frequency. Low phase noise is achieved over a broad tuning range by tuning the resonant filter of the bias circuit according to the same tuning signal used to tune the VCO frequency. Embodiment VCOs may be used, for example, in FMCW radar systems in which the transmit frequency is rapidly swept over a broad frequency range. In some embodiments, the resonant filter of the bias circuit is tuned by adjusting a capacitance of a capacitor that is magnetically coupled to a bias path of the VCO.

Figure 1A:
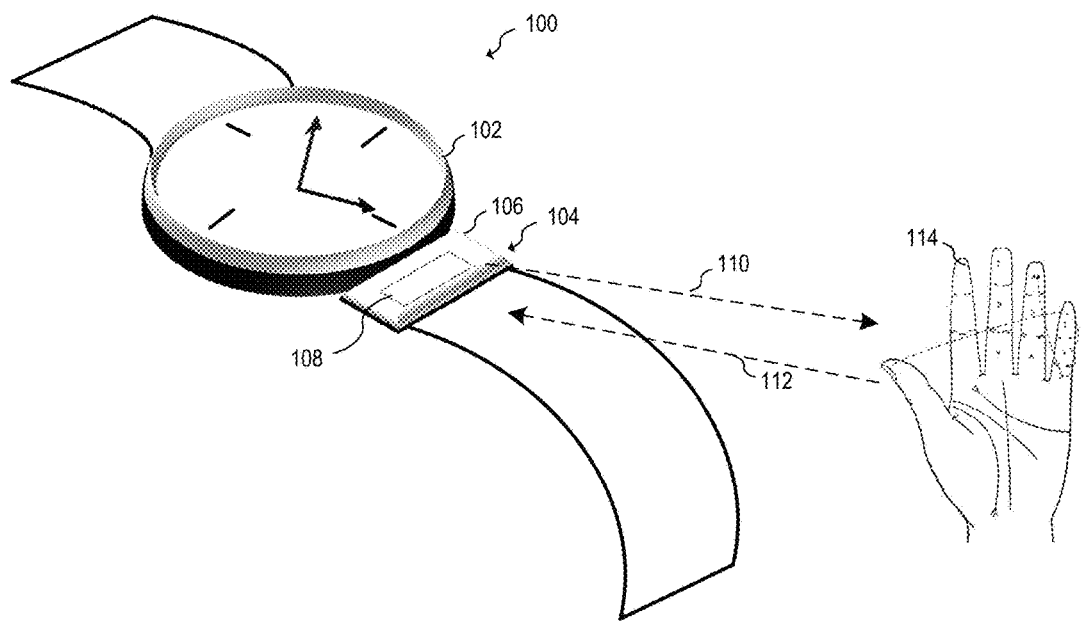
FIG. 1A illustrates an example gesture recognition system.

FIG. 1A illustrates an example gesture recognition application in which a smartwatch 100 is controlled using various hand gestures. As shown, smartwatch 100 includes a display element 102 physically coupled to a gesture recognition radar system 104. During operation, gesture recognition radar system 104 transmits RF signals no to target 114, which may be a human hand, and receives reflected RF signals 112 that are reflected by target 114. These reflected RF signals 112 are processed by the gesture recognition system to determine the position and motion of target 114 and/or to determine whether target 114 is providing a particular gesture. In some embodiments, gesture recognition radar system 104 may include a gesture recognition circuit 108 that is disposed within a housing 106. At least a portion of housing 106 is transparent or partially transparent to RF signals transmitted and received by gesture recognition circuit 108. It should be appreciated that gesture recognition circuit 108 may also be disposed within the body of display element 102.

In alternative embodiments, gesture recognition circuit 108 may be embedded within other devices including, but not limited to, car keys, smart phones, tablet computers, audio/visual equipment, kitchen appliances, HVAC controls, and automobiles. In some applications, such as automotive applications, gesture recognition circuit 108 may be embedded within a mobile device such as a car key or smart phone, which in turn communicates with a remote device to be controlled, such as an automobile or kitchen appliance. The data transfer between the mobile device and remote device could include any of a wide variety of communications technologies, including, e.g., Bluetooth, V2X, etc.

Figure 1B:
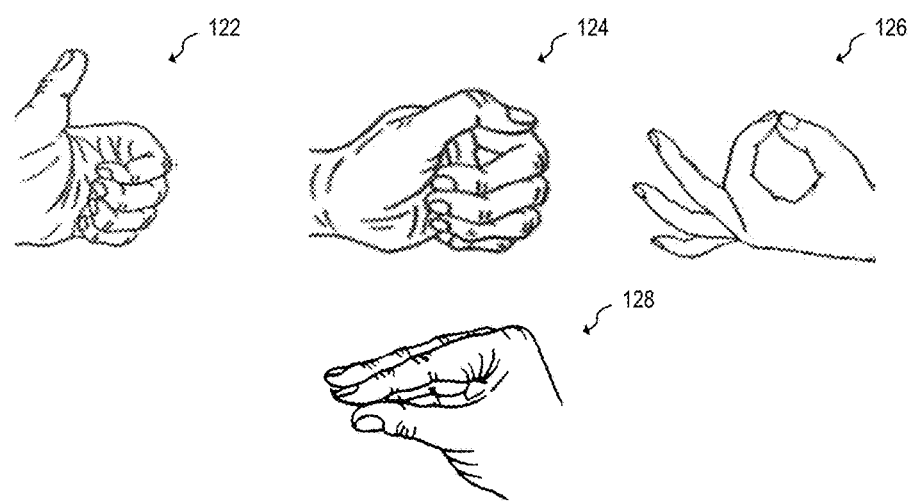
FIG. 1B illustrates example hand gestures recognizable by the gesture recognitions system of FIG. 1A.

Example hand gestures shown in FIG. 1B may include, for example, a "thumbs-up" gesture 122, a "closed fist" gesture 124, a "thumb-to-finger" gesture 126, or a "button press" gesture 128. Each of these example gestures could be used to control the functionality of smartwatch 100 or some other device or system. For example, "thumbs-up" gesture 122 could be used to open a smartwatch application, "closed fist" gesture 124 could be used to close the smartwatch application, "thumb-to-finger" gesture 126 in conjunction with motion between the thumb and index finger may be used to virtually rotate the hands on the clock display of smartwatch 100, and "button press" gesture 128 could be used to start and stop a stopwatch feature of smartwatch 100. In various embodiments, recognized gestures may be static or dynamic. Static gestures may be made by holding a hand in a fixed position such as the gestures 122, 124 and 128, and dynamic gestures may be made by moving the hand or a portion of the hand, such as moving the index finger with respect to the thumb such as with gesture 126. It should be understood that the above-mentioned gestures are just a few examples of many possible gestures that may be recognized by embodiment gesture recognition systems.

Figure 1C:
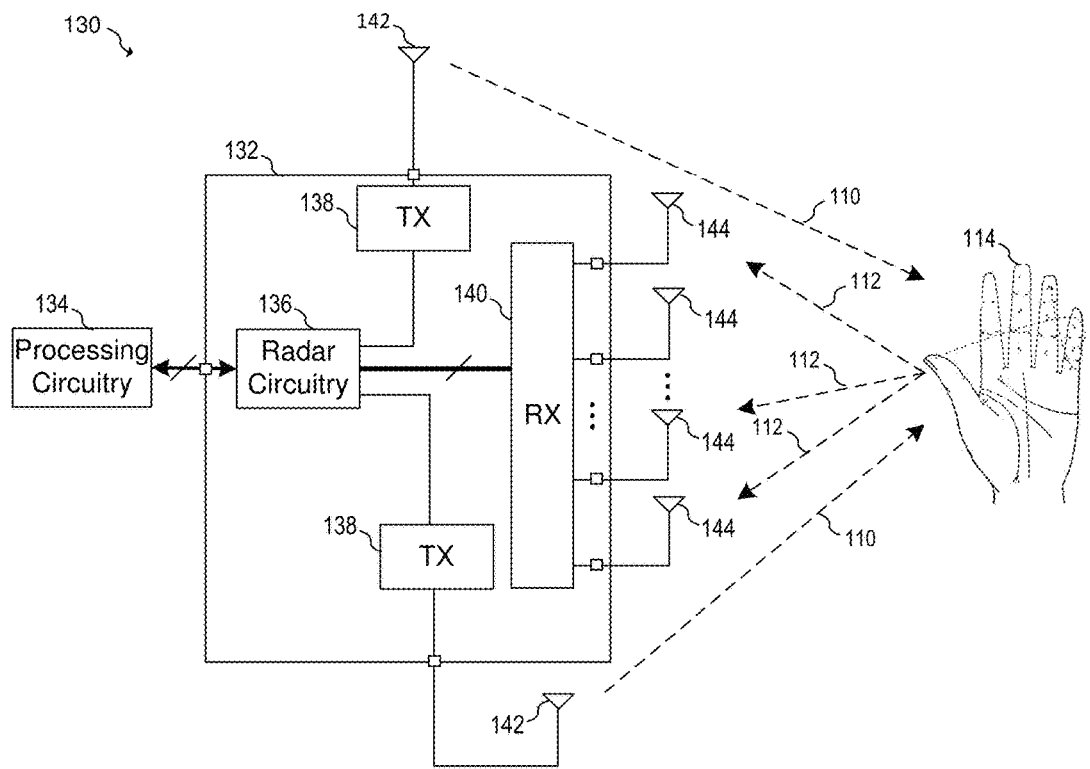
FIG. 1C illustrates a block diagram of a gesture recognition system.

FIG. 1C illustrates a block diagram of gesture recognition system 130 that includes radar front-end circuit 132 and processing circuitry 134. During operation, positions and gestures of target 114 may be detected by the gesture recognition system 130. For example, a gesture of two fingers tapping each other could be interpreted as a "button press," or a gesture of a rotating thumb and finger may be interpreted as turning a dial. While target 114 is depicted in FIG. 1C as being a hand, gesture recognition system 130 may also be configured to determine gestures and positions of other types of targets such as a human body, machinery and other types of animate or inanimate objects. Gesture recognition system 130 may be implemented, for example, using a two-dimensional mm-wave phase-array radar that measures the position and relative speed of target 114. The mm-wave phase-array radar transmits and receives signals in the 57 GHz to 64 GHz range. Alternatively, frequencies outside of this range may also be used. In some embodiments, radar front-end circuit 132 operates as a frequency modulated continuous wave (FMCW) radar sensor having multiple transmit and receive channels. Alternatively, other types of radar systems may be used such as a pulse modulated radar system to implement radar front-end circuit 132.

Radar front-end circuit 132 transmits and receives radio signals for detecting target 114 in three-dimensional space. For example, radar front-end circuit 132 transmits an incident RF signal and receives an RF signal that is a reflection of the incident RF signal from target 114. The received reflected RF signal is downconverted by radar front-end circuit 132 to determine beat frequency signals. These beat frequency signals may be used to determine information such as the location, speed, angle, etc., of target 114 in three-dimensional space.

In various embodiments, radar front-end circuit 132 is configured to transmit incident RF signals toward target 114 via transmit antennas 142 and to receive reflected RF signals from target 114 via receive antennas 144. Radar front-end circuit 132 includes transmitter front-end circuits 138 coupled to transmit antennas 142 and receiver front-end circuit 140 coupled to receive antennas 144.

During operation, transmitter front-end circuits 138 may transmit RF signals toward target 114 one at a time or simultaneously. While two transmitter front-end circuits 138 are depicted in FIG. 1C, it should be appreciated that radar front-end circuit 132 may include fewer or greater than two transmitter front-end circuits 138. Each transmitter front-end circuit 138 includes circuitry configured to produce the incident RF signals. Such circuitry may include, for example, RF oscillators, upconverting mixers, RF amplifiers, variable gain amplifiers, filters, transformers, power splitters, and other types of circuits.

Receiver front-end circuit 140 receives and processes the reflected RF signals from target 114. As shown in FIG. 1C, receiver front-end circuit 140 is configured to be coupled to four receive antennas 144, which may be configured as a 2×2 antenna array. In alternative embodiments, receiver front-end circuit 140 may be configured to be coupled to greater or fewer than four antennas, with the resulting antenna array being of various n×m dimensions depending on the specific embodiment and its specifications. Receiver front-end circuit 140 may include, for example, RF oscillators, upconverting mixers, RF amplifiers, variable gain amplifiers, filters, transformers, power combiners and other types of circuits.

Radar circuitry 136 provides signals to be transmitted to transmitter front-end circuits 138, receives signals from receiver front-end circuit 140, and may be configured to control the operation of radar front-end circuit 132. In some embodiments, radar circuitry 136 includes, but is not limited to, frequency synthesis circuitry, upconversion and downconversion circuitry, variable gain amplifiers, analog-to-digital converters, digital-to-analog converters, digital signal processing circuitry for baseband signals, bias generation circuits, and voltage regulators.

Radar circuitry 136 may receive a baseband radar signal from processing circuitry 134 and control a frequency of an RF oscillator based on the received baseband signal. In some embodiments, this received baseband signal may represent an FMCW frequency chip to be transmitted. Radar circuitry 136 may adjust the frequency of the RF oscillator by applying a signal proportional to the received baseband signal to a frequency control input of a phase locked loop. Alternatively, the baseband signal received from processing circuitry 134 may be upconverted using one or more mixers. Radar circuitry 136 may transmit and digitize baseband signals via a digital bus (e.g., a USB bus), transmit and receive analog signals via an analog signal path, and/or transmit and/or receive a combination of analog and digital signals to and from processing circuitry 134.

Processing circuitry 134 acquires baseband signals provided by radar circuitry 136 and performs one or more signal processing steps to evaluate them. In an embodiment, processing circuitry 134 acquires a baseband signal that represents the beat frequency signals. The signal processing steps may include performing a fast Fourier transform (FFT), a short-time Fourier transform (STFT), target classification, machine learning, and the like. Results of the signal processing steps are used to determine and perform an action on the device, such as smartwatch 100 of FIG. 1A. In addition to processing the acquired baseband signals, processing circuitry 134 may also control aspects of radar front-end circuit 132, such as the transmissions produced by radar front-end circuit 132.

The various components of gesture recognition system 130 may be partitioned in various ways. For example, radar front-end circuit 132 may be implemented on one or more RF integrated circuits (RFICs), antennas 142 and 144 may be disposed on a circuit board, and processing circuitry 134 may be implemented using a processor, a microprocessor, a digital signal processor and/or a custom logic circuit disposed on one or more integrated circuits/semiconductor substrates. Processing circuitry 134 may include a processor that executes instructions stored in a non-transitory memory to perform the functions of processing circuitry 134. In some embodiments, however, all or part of the functionality of processing circuitry 134 may be incorporated on the same integrated circuit/semiconductor substrate on which radar front-end circuit 132 is disposed.

In some embodiments, some or all portions of radar front-end circuit 132 may be implemented in a package that contains transmit antennas 142, receive antennas 144, transmitter front-end circuits 138, receiver front-end circuit 140, and/or radar circuitry 136. In some embodiments, radar front-end circuit 132 may be implemented as one or more integrated circuits disposed on a circuit board, and transmit antennas 142 and receive antennas 144 may be implemented on the circuit board adjacent to the integrated circuits. In some embodiments, transmitter front-end circuits 138, receiver front-end circuit 140, and radar circuitry 136 are formed on the same radar front-end integrated circuit (IC) die. Transmit antennas 142 and receive antennas 144 may be part of the radar front-end IC die, or may be separate antennas over or adjacent to the radar front-end IC die. The radar front-end IC die may further include conductive layers, such as redistribution layers (RDLs), used for routing and/or for the implementation of various passive or active devices of radar front-end circuit 132. In an embodiment, transmit antennas 142 and receive antennas 144 may be implemented using the RDLs of the radar front-end IC die.

Figure 1D:
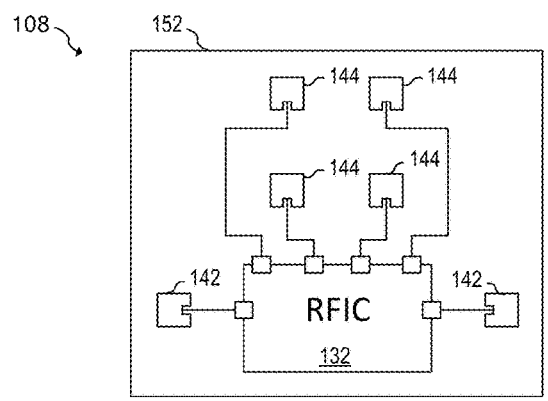
FIG. 1D illustrates a top view of circuit board including an antenna arrangement that can be used to implement an embodiment gesture recognition circuit.

FIG. 1D illustrates a top view of gesture recognition circuit 108 that includes radar front-end circuit 132 implemented as an RFIC coupled to transmit antennas 142 and receive antennas 144 implemented as patch antennas disposed on or within substrate 152. In some embodiments, substrate 152 may be implemented using a circuit board on which radar front-end circuit 132 is disposed and on which transmit antennas 142 and receive antennas 144 are implemented using conductive layers of the circuit board. Alternatively, substrate 152 represents a wafer substrate on which one or more RDLs are disposed and on which transmit antennas 142 and receive antennas 144 are implemented using conductive layers on the one or more RDLs. It should be appreciated that the implementation of FIG. 1D is just one of many ways that embodiment gesture recognition systems may be implemented.

Figure 2A:
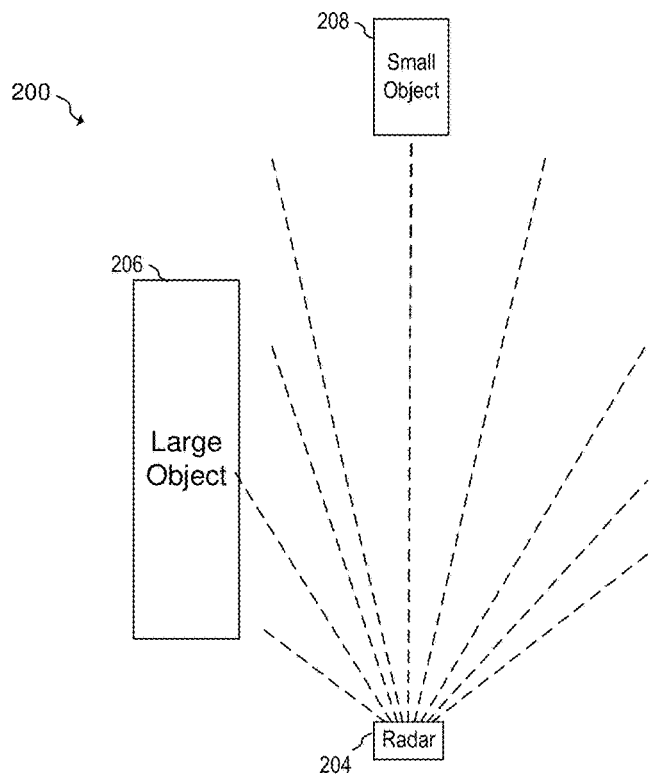
FIG. 2A illustrates an example radar scenario involving a large object and a small object.

FIG. 2A illustrates an example radar scenario 200 in which radar system 204 transmits and receives, for example, a frequency modulated continuous wave (FMCW) signal, and detects reflections of this transmitted signal in order to determine a distance between radar system 204 and other objects within range of radar system 204. In the illustrated scenario 200, a large object 206, is closer to radar system 204 than a small a small object 208. Radar system 204 may represent, for example, a gesture recognition radar, in which case large object 206 may represent a large portion of the user's hand directly adjacent to radar system 204 and small object 208 may represent a tip of the user's finger spaced farther from radar system 204. In another example, radar system 204 may represent an automotive radar, in which case large object 206 may represent a large vehicle, such as a truck, traveling close to 2014, and small object 208 may represent a small vehicle, such as a motorcycle traveling at a larger distance from radar system 204 than large object 206. Under normal operating conditions, the echo or reflection off large object 206 is of a higher amplitude than the reflection off small object 208 because large object 206 is both larger and closer to radar system 204 than small object 208.

Figure 2B:
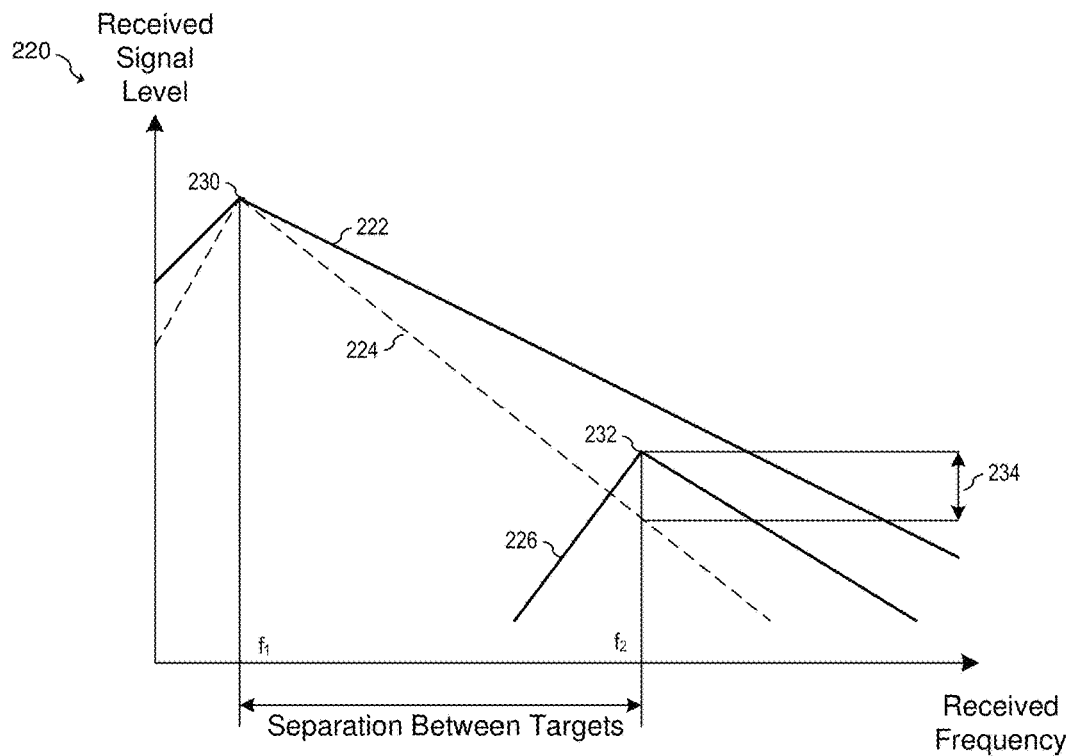
FIG. 2B illustrates a graph of received signal level versus received frequency for the scenario of FIG. 2A.

FIG. 2B illustrates a graph 220 of received signal level versus received frequency for the scenario of FIG. 2A. Signal level versus frequency curve 222 corresponds to the received reflection from large object 206 and the frequency f1 of signal level peak 230 corresponds to the distance between radar system 204 and large object 206. Likewise, signal level versus frequency curve 226 corresponds to the received reflection from small object 208 and the frequency F2 of the signal level peak 232 corresponds to the distance between radar system 204 and small object 208. Accordingly, the distance between large object 206 and small object 208 is proportional to the separation between frequencies F1 and F2.

Along with the desired output signal, the phase noise of the radar transmitter is also transmitted and reflected. The phase noise 224 reflected from large object 206 is represented as a dashed line. As seen in graph 220, phase noise 224 affects the ability of the radar to receive signals reflected from small object 208. The signal to noise ratio between signal level peak 232 due to small object 208 and the corresponding noise floor due to phase noise reflected from large object 206 is represented as length 234. It can be seen from the graph of FIG. 2B, that phase noise affects the ability of radar system 204 to discern small and distant objects. The higher the phase noise of the radar transmitter, the less the radar system is able to discern small and distant objects.

One type of noise that may exasperate phase noise degrade the ability of a radar system to detect closely spaced objects is device flicker noise. In fact, in radar-based sensor systems that operate at very low intermediate frequencies (IF), the absolute value of phase noise is commonly dominated by flicker noise. The magnitude of flicker noise often depends on the choice of technology. For example, a MOS transistor may exhibit a higher flicker noise corner frequencies (several MHz) compared to a bipolar transistor (few kHz). Accordingly, a CMOS mm-Wave VCO exhibits roughly 10 dB worse flicker noise compared to a bipolar realization. While the phase noise of a VCO that is related to thermal noise base may be reduced by increasing voltage swing or providing a higher tank quality factor, the flicker noise cannot be reduced as easily.

LC tank based VCOs are widely used at mm-Wave systems due to the much lower phase noise compared to ring VCO realization. The part of the phase noise "skirt" spectrum related to thermal noise can be reduced by increasing voltage swing or providing a higher tank quality factor. The part related to the flicker noise cannot be reduced easily, as it is mainly technology dependent.

Figure 2C:
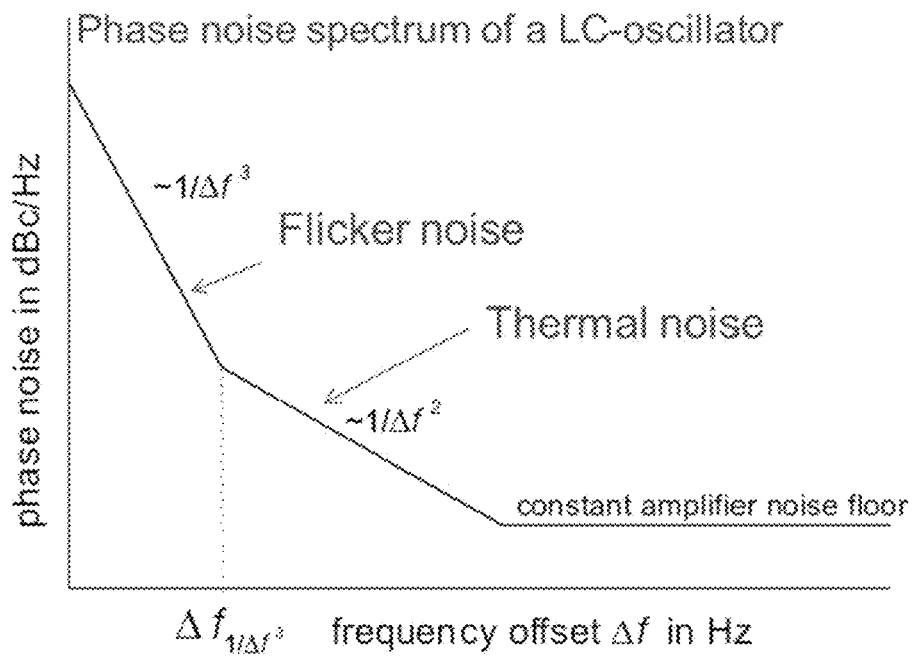
FIG. 2C illustrates graph of phase noise vs. frequency for a typical RF VCO.

FIG. 2C illustrates a graph of phase noise vs. frequency offset from the carrier that shows how various noise sources contribute to the total phase noise to a typical RF VCO. As shown, for frequencies below the flicker noise corner frequency of $\Delta f_{1/\Delta f^3}$, the phase noise is proportional to about $1/\Delta f^3$. Thus, at these low frequencies, the phase noise spectrum is dominated by flicker noise. At frequencies higher than the flicker noise corner frequency of $\Delta f_{1/\Delta f^3}$, the phase noise is proportional to about $1/\Delta f^2$ and is dominated by thermal noise. Eventually, at higher frequencies, the noise of the RF VCO is dominated by the thermal noise of the amplifier buffering the output of the RF VCO and appears flat over frequency.

Figure 2D:
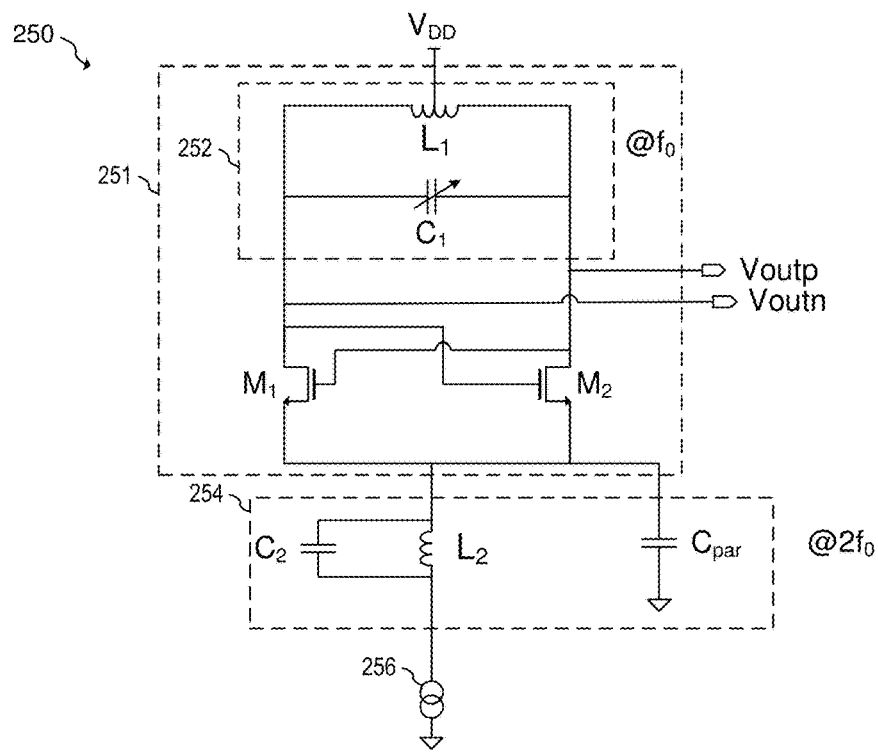
FIG. 2D illustrates a schematic of an exemplary VCO.

FIG. 2D illustrates a schematic of an exemplary VCO 250 that includes a VCO core 251 having including cross-coupled transistors $M_1$ and $M_2$ and tank 252 that includes tunable capacitor $C_1$ and inductor $L_1$. As shown, inductor $L_1$ has a center tap that is connected to power supply terminal $V_{DD}$ to provide power to VCO 250. A bias current is provided to VCO core 251 via current source 256. During operation, transistors M1 and M2 provide energy to tank 252 which causes tank 252 to resonate and produce oscillations. Positive feedback due to the cross-coupling of transistors $M_1$ and $M_2$ maintains the oscillations. The frequency of oscillation $f_0$ of VCO 250 is approximately:

$$f_0 = \frac{1}{2\pi\sqrt{L_S C_2}}.$$

The frequency of oscillation $f_0$ of VCO 250 may be tuned or adjusted by changing the capacitance of capacitor $C_1$.

The flicker noise related part of VCO phase noise "skirt" generated by VCO 250 includes noise contributed by the direct coupling of the flicker noise of the cross-coupled pair of transistors $M_1$ and $M_2$ to the output. This noise is most dominant when the transistors $M_1$ and $M_2$ conduct equal current, which takes place at each zero crossing, which occurs each half period at a frequency of twice the oscillation frequency $2f_0$. In addition, switching of transistors $M_1$ and $M_2$ commutates noise generated by current source 256 like a single balanced mixer. Thus, noise generated by current source 256 at a frequency of twice the oscillation frequency $2f_0$ is mixed with the fundamental $f_0$ produced by VCO core 251 and is converted directly to phase noise. Non-linear tank capacitance (Groszkowski effect) and varactor AM-PM conversion also play a role in converting thermal and flicker noise to phase noise.

In embodiments, the effect of noise injected from current source 256 can be reduced or minimized by implementing noise filter 254 coupled between VCO core 251 and current source 256 that has a resonance at the second harmonic $2f_0$ of the frequency of oscillation of VCO 250. This noise filter 254, also known as "H2 filter," includes a parallel resonant LC circuit that includes inductor $L_2$ and a parallel combination of capacitor $C_2$ and capacitor $C_{par}$ representing the parasitic capacitance seen at the sources of transistors $M_1$ and $M_2$.

Figure 2E:
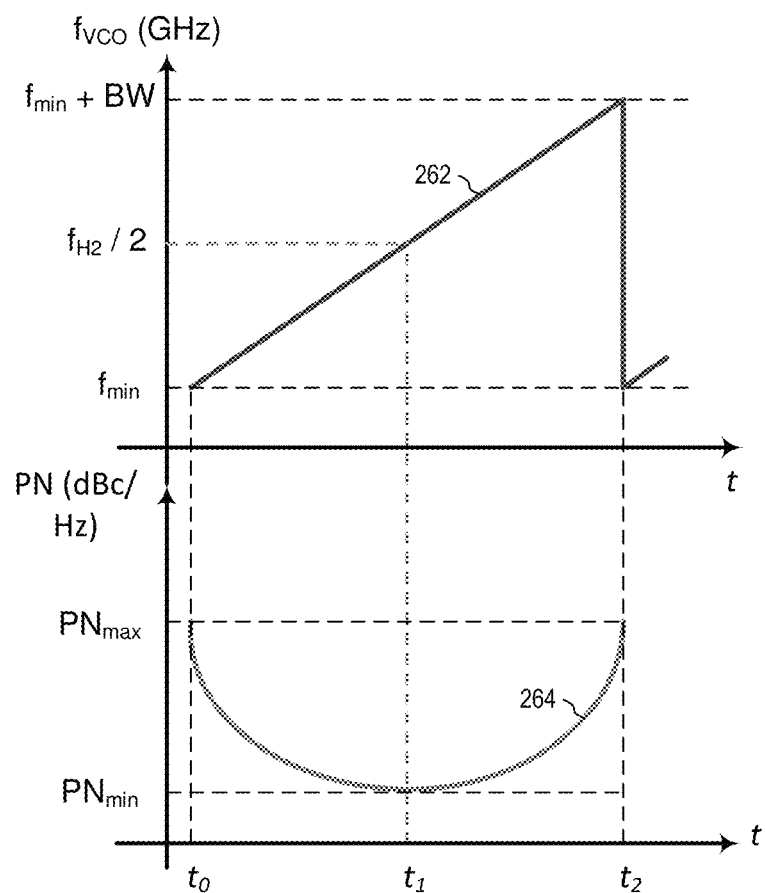
FIG. 2E illustrates a waveform diagram showing the effect of VCO frequency on phase noise for an FMCW radar signal.

In various implementations, VCO 250 achieves a reduced phase noise when the resonant frequency of noise filter 254 is turned to the second harmonic $2f_0$ of the frequency of oscillation of VCO 250. However, as shown in FIG. 2D, noise filter 254 using fixed components and is therefore only tunable to a single frequency. Thus, the phase noise of VCO 250 degrades as its frequency of operation varies. This effect is illustrated in FIG. 2E that illustrates frequency 262 and phase noise 264 of a VCO with respect to time for a frequency "chirp" that might be used in an FMCW radar system. The VCO whose performance is represented in FIG. 2E has a noise filter tuned to frequency $f_{H2}$ as described above with respect to FIG. 2D. As shown, frequency 262 increases from $f_{min}$ at time $t_0$ to $f_{min}$+BW at time $t_2$. The corresponding phase noise 264 has a maximum value $PM_{max}$ at the edges of the frequency chirp and a minimum value $PM_{min}$ in the middle of the frequency chirp at time $t_1$ when the frequency 262 of the chirp is at $f_{H2}/2$, which is one-half the resonant frequency $f_{H2}$ of the noise filter. The effect of varying phase noise over frequency can be quite pronounced in gesture recognition radar systems that might have a tuning range, for example, of 6 GHz.

Figure 3A:
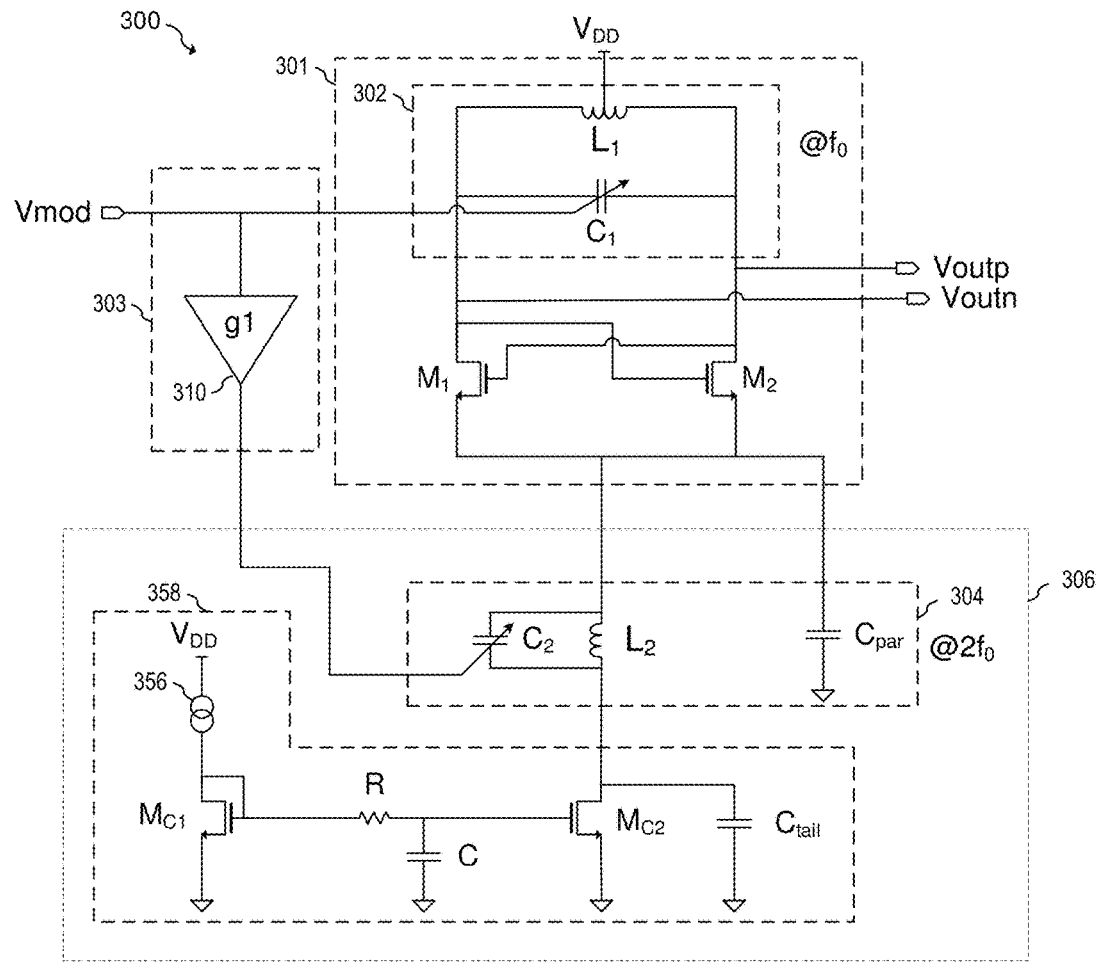
FIGS. 3A-3E illustrate schematics of embodiment VCOs.

In embodiments of the present invention, the resonant frequency both of the VCO tank and the noise filter are adjusted to the VCO's frequency of operation. An example embodiment VCO 300 is illustrated in FIG. 3A that includes a tunable filtered current source 306 in addition to a tunable resonator 302, such that during operation, both tunable resonator 302 and tunable filter 304 are tuned according to VCO tuning signal Vmod.

As shown, VCO 300 includes VCO core 301 having cross-coupled transistors $M_1$ and $M_2$ and tunable resonator 302 having variable capacitor $C_1$ coupled in parallel with inductor $L_1$ to form a parallel resonant tank. As shown, the center tap of inductor $L_1$ is connected to power supply node $V_{DD}$ in order to supply power to VCO 300. A bias current is provided to VCO core 301 via current source 358, which includes current mirror transistors $M_{C1}$ and $M_{C2}$ and current source 356. During operation, the current produced by current source 358 is mirrored from diode connected transistor $M_{C1}$ to transistor $M_{C2}$. Resistor R and capacitor C form a lowpass filter that filters noise generated by transistor $M_{C2}$ and current source 256. Capacitor $C_{tail}$ represents the parasitic capacitance of the drain of transistor $M_{C2}$.

In various embodiments, VCO 300, as well as other VCO structures disclosed herein, may be implemented on a semiconductor substrate, such as a silicon substrate and may be implemented on the same semiconductor substrate as other RF circuitry. For example, VCO 300, as well as other VCO structures disclosed herein may be disposed on the same semiconductor substrate as radar front-end circuit 132 described above with respect to FIGS. 1C and 1D.

Tunable filter 304 includes a tunable resonant circuit implemented as an LC tank formed by variable capacitor $C_2$ coupled in parallel with inductor $L_2$. Alternatively, other types of tunable resonant circuits or resonators may be used to implement tunable filter 304. In various embodiments capacitor $C_1$ and inductor $L_1$ of tunable resonator 302, variable capacitors $C_1$ and $C_2$ may be implemented using, for example, on or more varactors, digitally selectable capacitors, other variable capacitance structures known in the art, or combinations thereof. In some embodiments, variable capacitors $C_1$ and $C_2$ may be implemented in a semiconductor process using MOM/MIM capacitors, MOS capacitors, pn-junction capacitors, or POLY-POLY capacitors, or other semiconductor-based capacitor structures known in the art. Inductors $L_1$ and $L_2$ may be implemented, for example, using on-chip spiral inductors, transmission line elements, or other inductor structures known in the art.

During operation, tuning circuit 303 coupled to VCO tuning tuning signal Vmod provides a filtered current source tuning signal to variable capacitor $C_2$ of tunable filter 304. As shown, in the embodiment FIG. 3A, tuning circuit 303 includes an amplifier 310 having a gain g1. In various embodiments, the values of capacitor $C_2$, inductor $L_2$, gain g1, as well as the bias conditions of amplifier 310, are adjusted such that tunable filter 304 is tuned to the second harmonic of the oscillation frequency of VCO 300. Accordingly, the resonant frequency of the LC tank of tunable filter 304 may be tuned to be twice the resonant frequency of tunable resonator 302. Thus, $$f_{T2} = 2f_0 \frac{1}{2\pi\sqrt{L_2(C_2 + C_{par})}} = \frac{2}{2\pi\sqrt{L_1 C_1}},$$

where $f_{T2}$ is the resonant frequency of tunable filter 304, $f_0$ is the resonant frequency of tunable resonator 302, and $C_{par}$ is the parasitic capacitance seen at the drains of transistors $M_1$ and $M_2$. In one embodiment directed toward a gesture recognition system, $f_0$ is about 60 GHz, $f_{T2}$ is about 120 GHz, and the swept frequency range for $f_0$ is between about 6 GHz and about 7 GHz. Alternatively, other frequencies and swept frequency ranges could be used depending on the particular system and its specifications. For example, in automotive radar systems, $f_0$ is about 80 GHz, $f_{T2}$ is about 160 GHz, and the swept frequency range for $f_0$ is between about 76 GHz and about 81 GHz.

Variable capacitor $C_1$ may be implemented using, for example, on or more varactors, digitally selectable capacitors, or other variable capacitance structures known in the art. As shown, the center tap of inductor $L_1$ is connected to power supply node $V_{DD}$ in order to supply power to VCO 300. Inductor $L_1$ may be implemented using on-chip spiral inductors, transmission line elements, or other inductor structures known in the art.

Figure 3B:
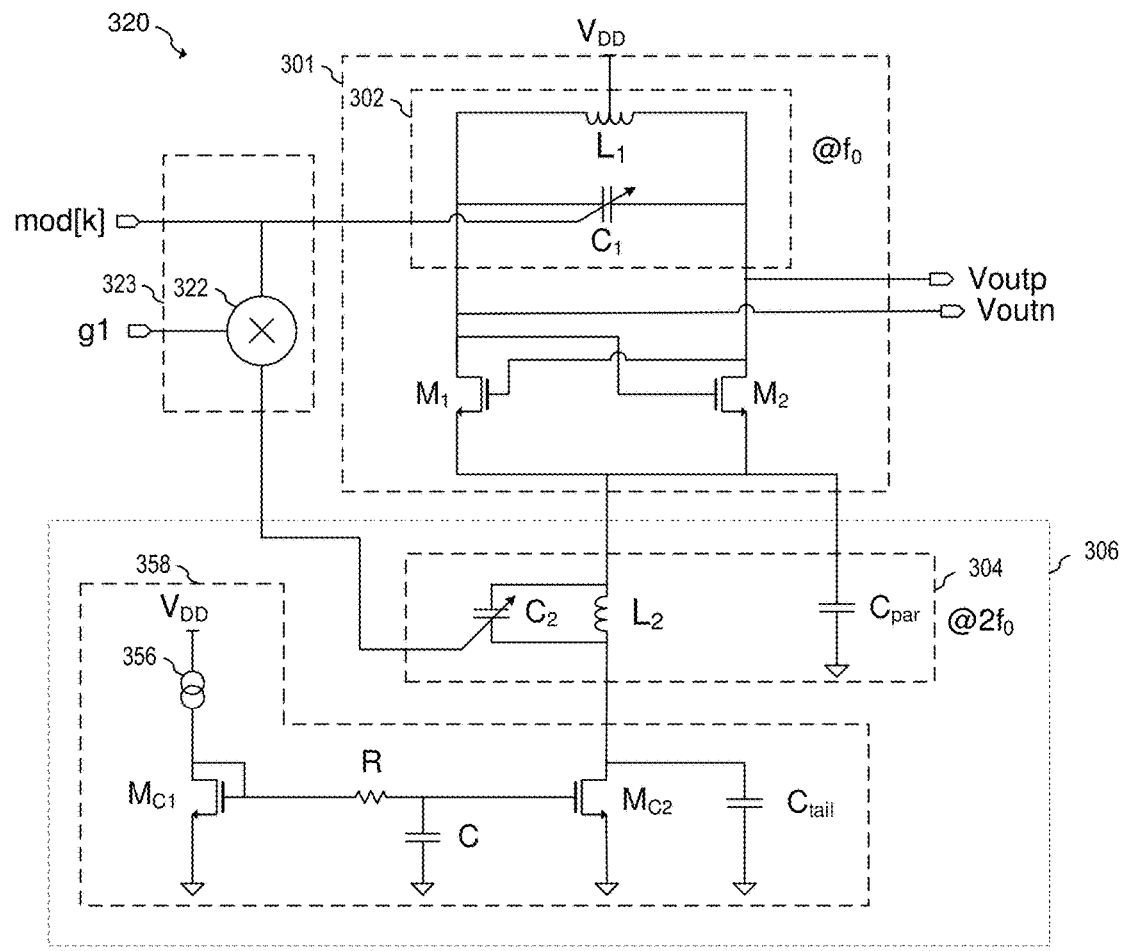

FIG. 3B illustrates embodiment VCO 320 according to a digitally tuned implementation. VCO 320 is similar to VCO 300 described above with respect to FIG. 3A, with the exception that VCO tuning signal mod[k] is a k-bit digital signal representing the desired tuning frequency of VCO 320. As shown, tuning circuit 323 includes a digital multiplier 322 that scales VCO tuning signal mod[k] by a factor of g1 prior to being applied to variable capacitor $C_2$ of tunable filter 304. In the embodiment of FIG. 3B, variable capacitor $C_1$ of tunable resonator 302 and variable capacitor $C_2$ of tunable filter 304 may be implemented, for example, using a plurality of digitally selectable capacitors or a digitally selectable capacitor array.

Figure 3C:
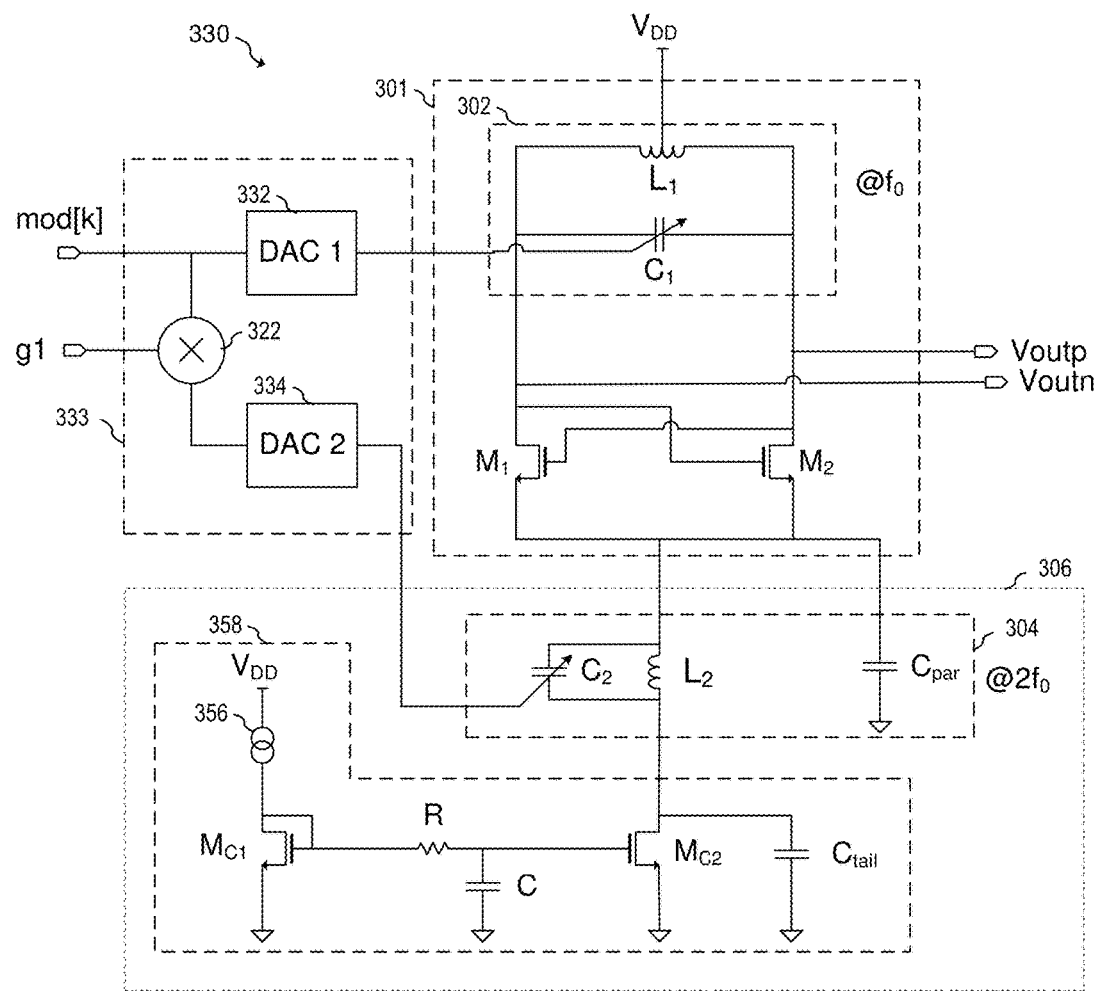

FIG. 3C illustrates embodiment VCO 330 according to a further digitally tuned implementation. VCO 330 is similar to VCO 320 described above with respect to FIG. 3B, with the exception that tuning circuit 333 includes digital to analog converters (DACs) 332 and 334 in addition to digital multiplier 322. Digital multiplier 322 multiplies the digital VCO tuning signal by gain factor g1 prior to its being converted to an analog signal via DAC 334. As shown, the output of DAC 332 is coupled to variable capacitor $C_1$ of tunable resonator 302 and the output of DAC 334 is coupled to capacitor $C_2$ of tunable filter 304. Accordingly, variable capacitors $C_1$ and $C_2$ may be implemented using variable capacitor structures, such as varactors, having a capacitance that changes according to an applied voltage. DACs 332 and 334 may be implemented using DAC architectures known in the art, including, but not limited to a delta-sigma DAC and a binary-weighted DAC using switched resistors, switched current sources or switched capacitors. In one embodiment DAC 332 and 334 each have a 10-bit resolution. Alternatively, other resolutions may be used.

Figure 3D:
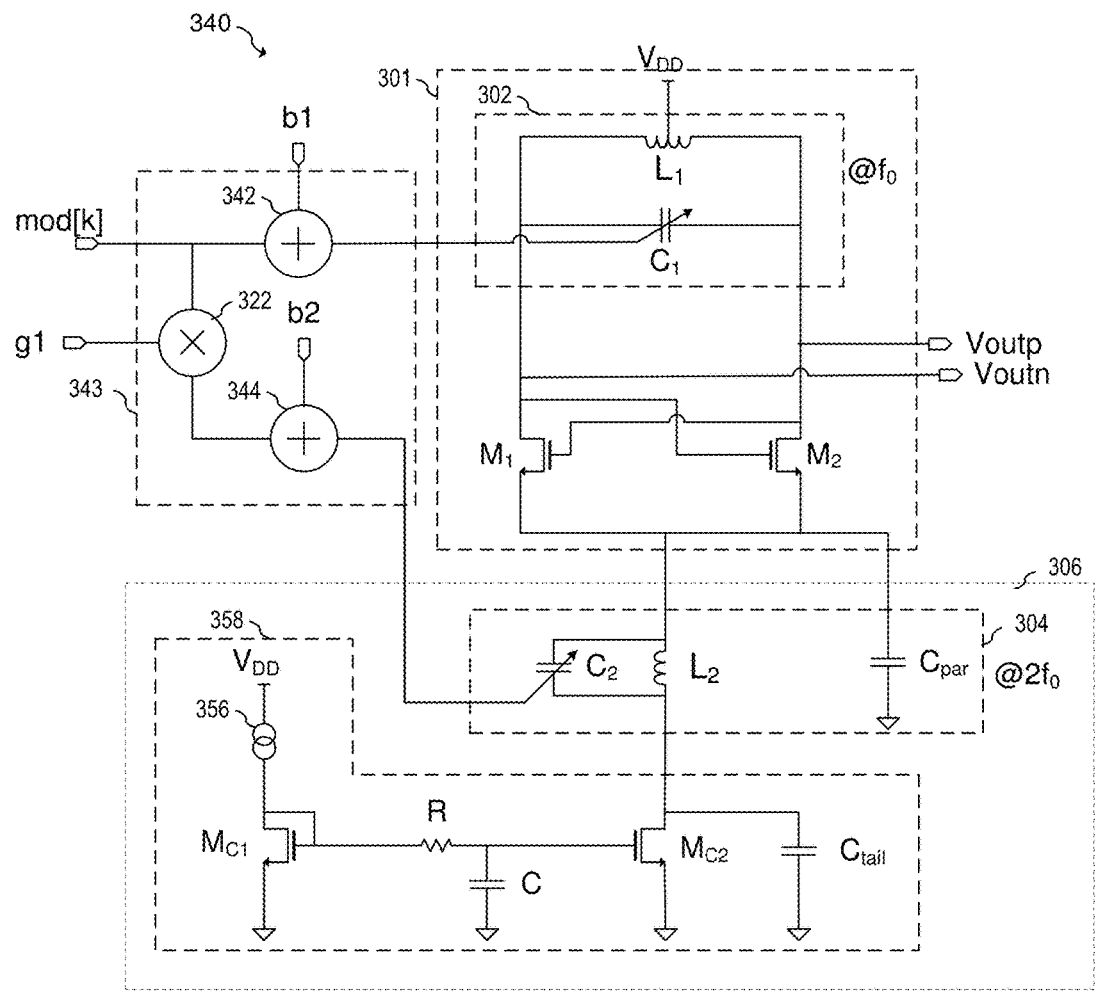

FIG. 3D illustrates embodiment VCO 340 according to a further digitally tuned implementation. VCO 340 is similar to VCO 320 described above with respect to FIG. 3B, with the addition of summing circuits 342 and 344 in tuning circuit 343 that apply an offset value b1 to tunable resonator 302 and an offset value b2 to tunable filter 304, respectively. These offset values in conjunction with gain g1 may be used to calibrate VCO 340 such that the resonant frequency of tunable filter 304 is tuned to the second harmonic of the resonant frequency of tunable resonator 302. Summing circuits 342 and 344 may be implemented using digital summing circuits known in the art, such as adders. As shown, tuning circuit 343 applies a digital signal to capacitors $C_1$ and $C_2$ such that capacitors $C_1$ and $C_2$ may be implemented using digitally programmable capacitor circuits. In an alternative embodiments, a first DAC may be coupled between the output of summing circuit 342 and capacitor $C_1$ and a second DAC may be coupled between the output of summing circuit 344 and the capacitor $C_2$ in a similar manner as the embodiment of FIG. 3D to allow for the control of voltage (or current) controlled capacitor circuits.

Figure 3E:
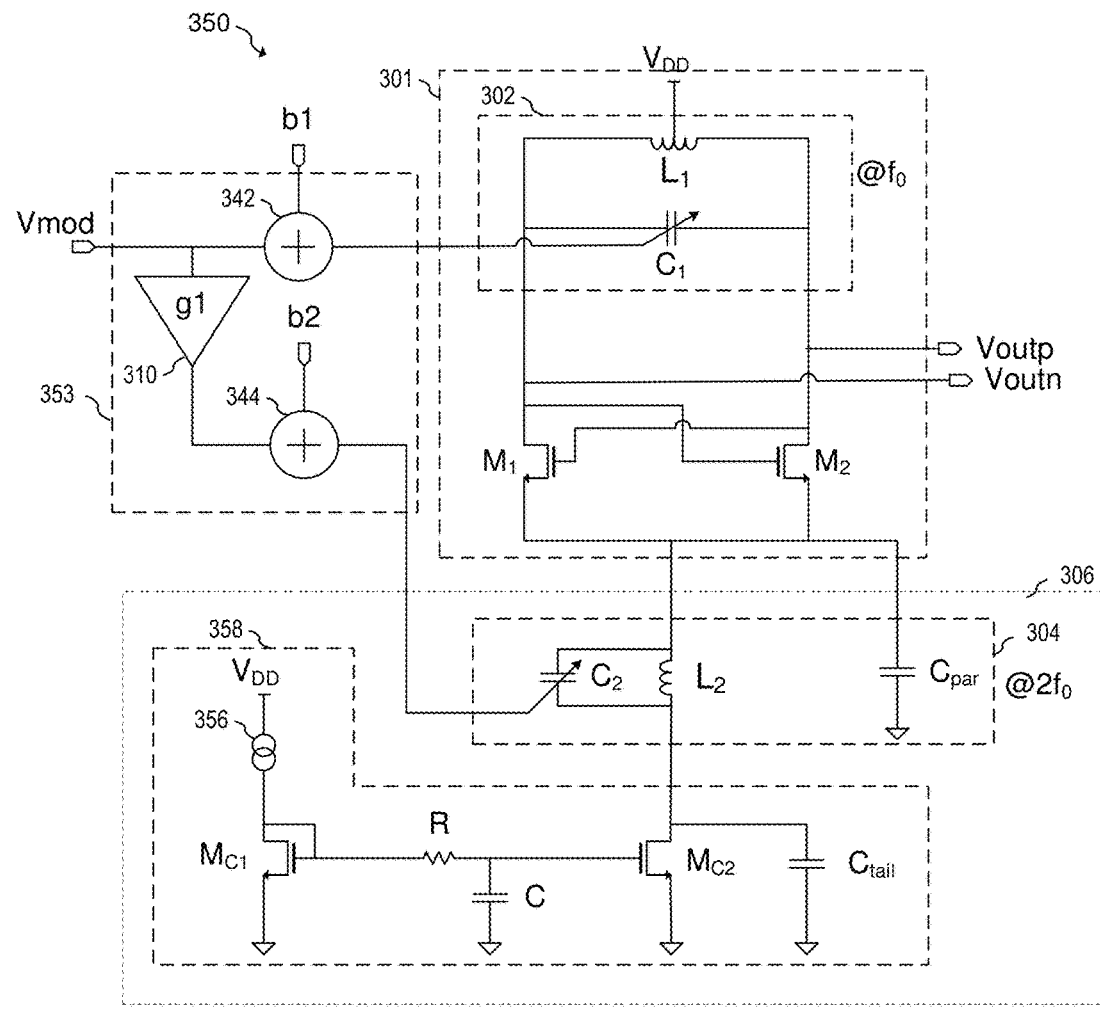

FIG. 3E illustrates embodiment VCO 350 according to a further analog tuned implementation. VCO 350 is similar to VCO 300 described above with respect to FIG. 3A, with the addition of summing circuits 352 and 354 in tuning circuit 353 that apply an offset value b1 to tunable resonator 302 and an offset value b2 to tunable filter 304, respectively. Summing circuits 352 and 352 may be implemented, for example, using summing circuits known in the art. In some embodiments, OPAMP-based summing circuits and/or current summing circuits may be used.

Figure 4A:
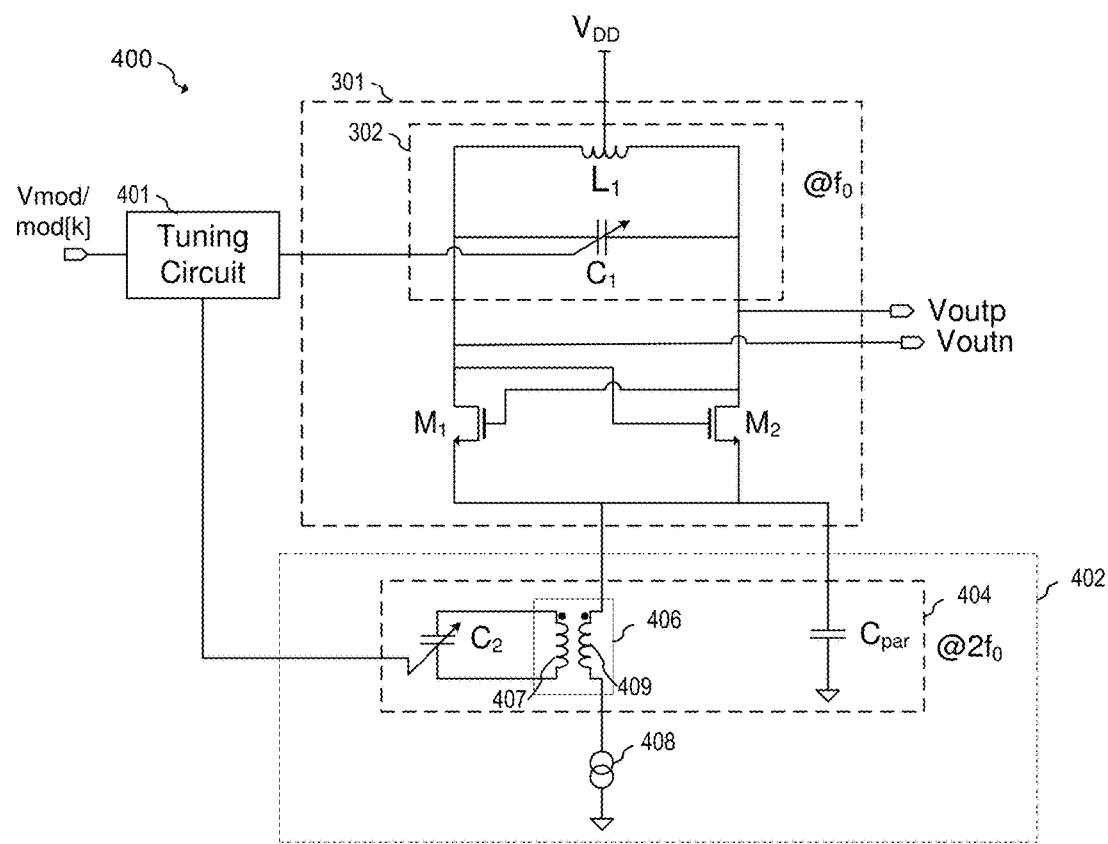
FIGS. 4A-4D illustrate schematics of further embodiment VCOs.

In some embodiments, the tunable current source filter may be implemented in a manner that variable capacitor $C_2$ is not directly connected to the bias path of the VCO. An example of such an embodiment is illustrated in FIG. 4A showing VCO 400 that includes VCO core 301 having tunable resonator 302 and cross-coupled transistors $M_1$ and $M_2$ as described above. Filtered current source 402 provides a bias current to VCO core 301 and includes tunable filter 404 and current source 408. Current source 408 may be implemented in a similar manner as current source 358 shown in FIG. 3A or may be implemented using other current source circuits and systems known in the art.

Tuning circuit 401 provides tuning signals to tunable resonator 302 and filtered current source 402 based on an analog tuning signal Vmod or a digital tuning signal mod[k] that is connected to tuning circuit 401 at a tuning signal input. In some embodiments, tuning signal Vmod or mod[k] is directly connected to tuning circuit 401. In various embodiments, tuning circuit 401 is implemented, for example, using tuning circuits 303, 323, 333, 343 or 353 described above with respect to FIGS. 3A-3E.

As shown, tunable filter 404 includes variable capacitor $C_2$ coupled in parallel with a first winding 407 of transformer 406. Variable capacitor $C_2$ and the first winding 407 of transformer 406, however, are not directly connected to current source 408. Rather, these components are magnetically coupled to the second winding 409 of transformer 406 that is connected between current source 408 and cross-coupled transistors $M_1$ and $M_2$. In some cases, the voltage across tunable filter 404 may be dependent on bias current, VCO frequency, and VCO amplitude, such that the voltage across tunable filter 404 changes over operating condition. In embodiments that use varactors, these changing operating conditions may cause the tuning characteristic of a resonant tank placed directly in the bias current path of VCO 400 to be non-linear. By magnetically coupling capacitor $C_2$ and the first winding 407 of transformer 406 to current source 408 and VCO core 301, the voltage across variable capacitor $C_2$ can be kept relatively constant over the operation range of VCO 400, thereby allowing for a wider, more linear tuning range that is less dependent on operating conditions in some embodiments.

In an embodiment, the capacitance $C_{second}$ seen at second winding 409 of transformer 406 is transformed by the turns ratio n of transformer 406:

$$C_{second} = C_2 n^2.$$

Using transformer 406, the range of capacitance seen at the second winding 409 of transformer 406 can be extended. For example, in one embodiment, using variable capacitor C2 having a capacitance range of between 10 fF and 100 fF and transformer 406 having a 2:1 turns ratio produces a capacitance seen as the second winding 409 of transformer 406 of between about 40 fF and about 400 fF. Alternatively, other capacitance ranges and turns ratios may be used depending on the particular embodiment and its specifications.

Figure 4B:
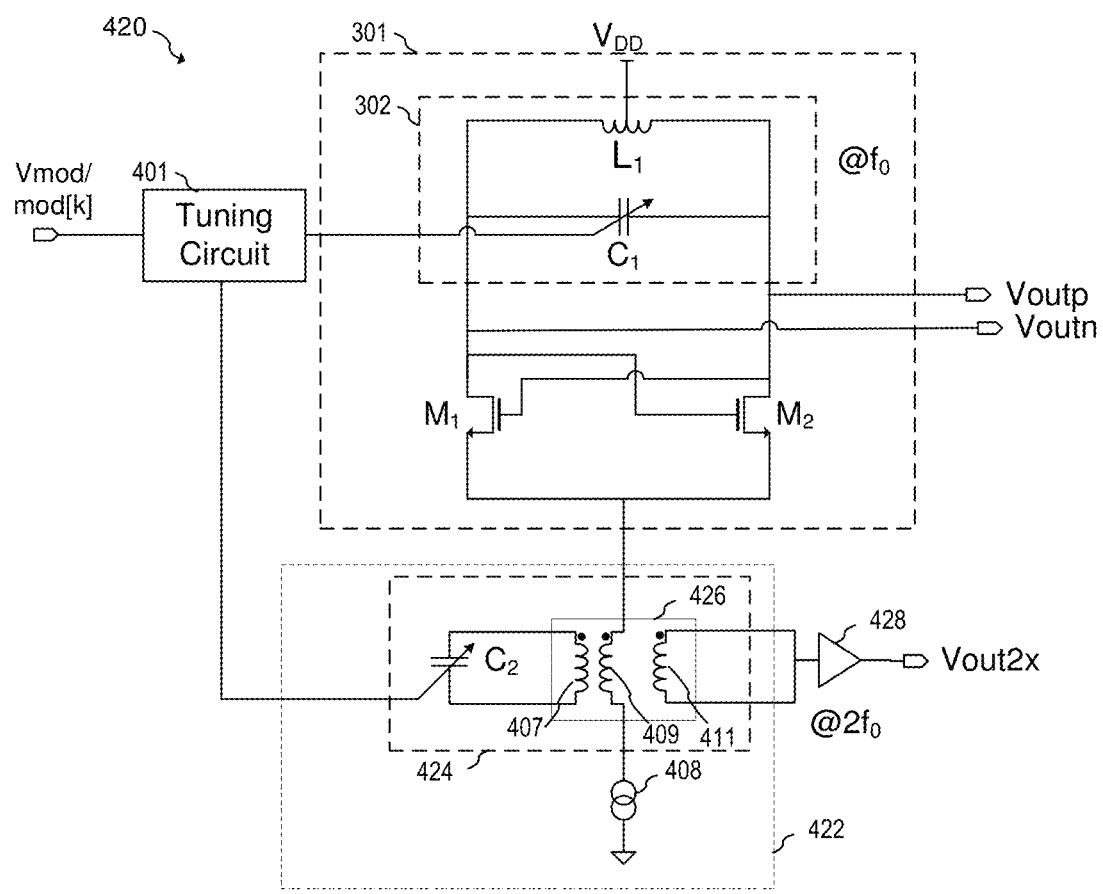

FIG. 4B illustrates VCO 420 according to a further embodiment of the present invention. VCO 420 is similar to VCO 400 described above with respect to FIG. 4A, with the addition of a buffer 428 that may be used to amplify the second harmonic $2f_0$ of the oscillation frequency of VCO 420. As shown, transformer 426 of tunable filter 424 that is contained in filtered current source 422 includes a third winding 411 that acts as a common-mode sensor and allows the second harmonic $2f_0$ of the oscillation frequency of VCO 420 to be buffered by buffer 428. In various embodiments, buffer 428 may be implemented using high-frequency VCO buffer circuits known in the art.

Figure 4C:
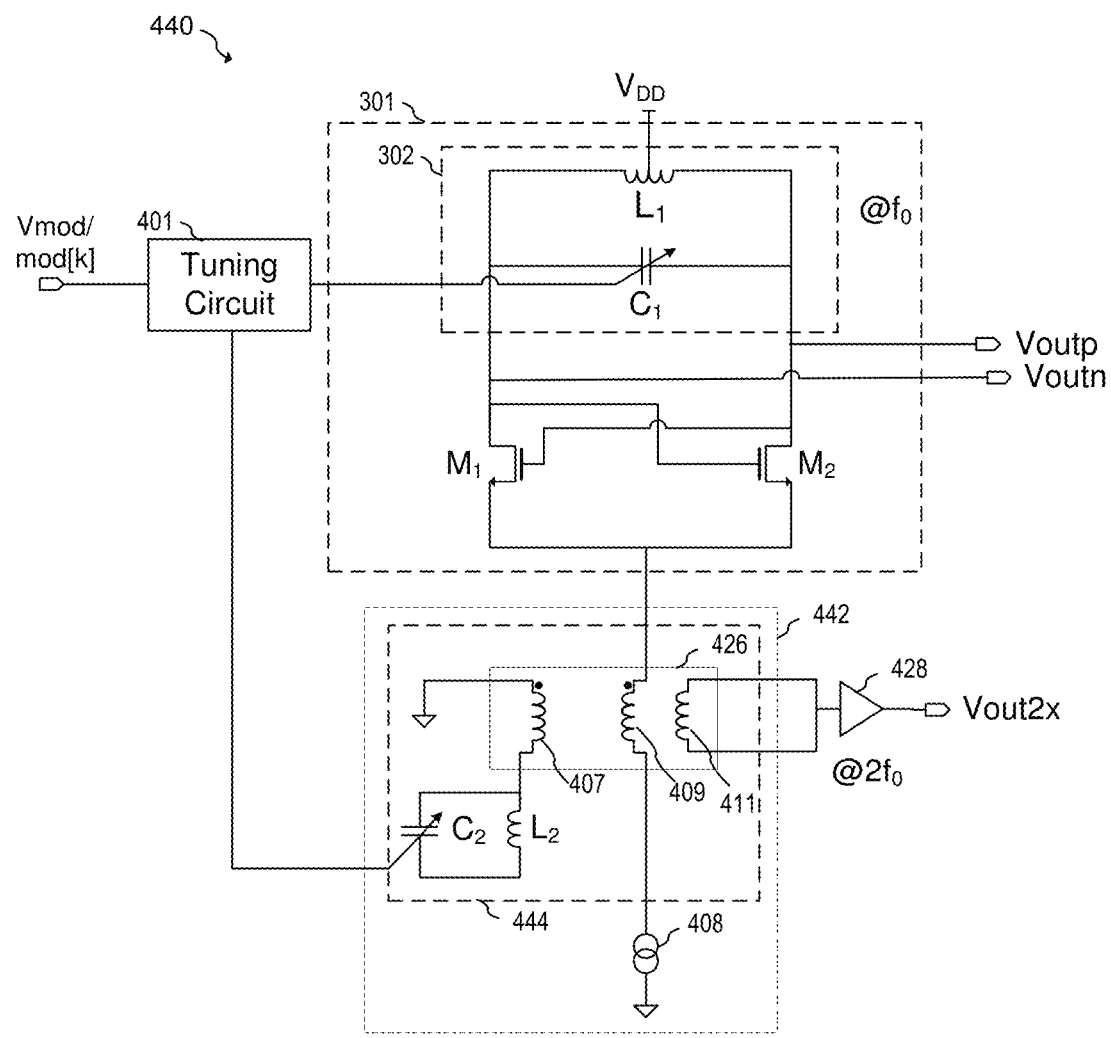

FIG. 4C illustrates VCO 440 according to a further embodiment of the present invention. VCO 440 is similar to VCO 420 described above with respect to FIG. 4B, with the exception that tunable filter 444 of filtered current source 442 includes a resonant LC circuit coupled in series with first winding 407 of transformer 426. As shown the LC circuit includes tunable capacitor $C_2$ coupled in parallel with inductor $L_2$. By using this structure, the frequency tuning range can be increased.

Figure 4D:
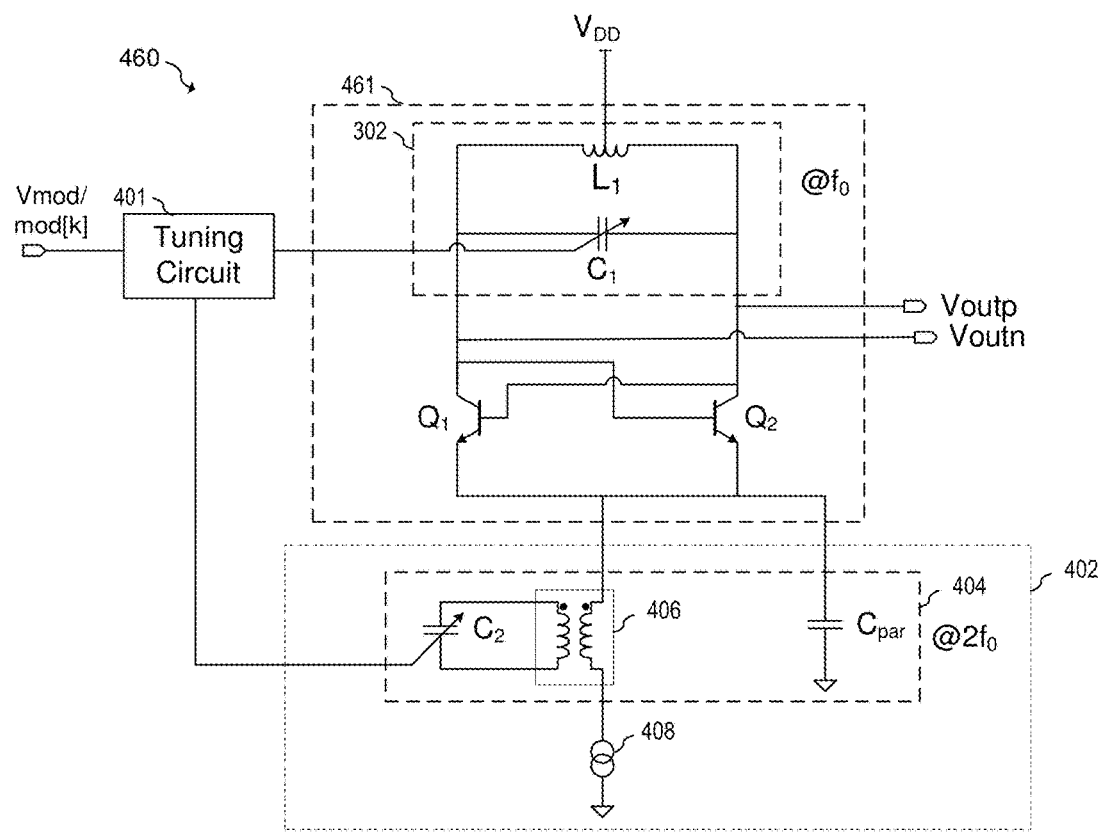

FIG. 4D illustrates VCO 460 according to a further embodiment of the present invention. VCO 460 is similar to VCO 400 described above with respect to FIG. 4A, with the exception that VCO core 461 uses cross-coupled bipolar transistors $Q_1$ and $Q_2$, such as heterojunction bipolar transistors (HBTs) instead of NMOS transistors $M_1$ and $M_2$ illustrated in FIG. 4A. It should be appreciated that the embodiments disclosed herein in the other FIGS. may also be implemented using other types of transistors besides NMOS or MOS transistors. For example, transistor types including, but not limited to PMOS, HEMP and/or HBT devices may be used for all embodiments disclosed herein.

Figure 5A:
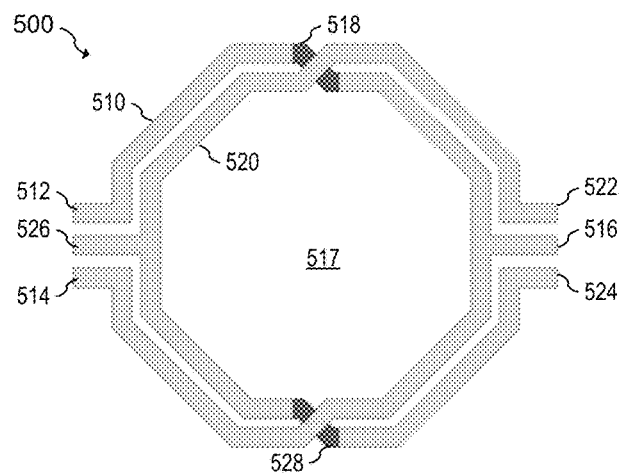
FIGS. 5A and 5B illustrate plan view of embodiment transformers.

In some embodiments, transformers 406 and 426 illustrated in FIGS. 4A-4D may be implemented using a symmetrical transformer in which the electrical characteristics of each winding are closely matched. FIG. 5A shows a layout of an integrated symmetrical transformer 500 that may be used to implement transformers 406 and 426 having a 1:1 turns ratio. As shown, transformer 500 includes a first winding 510 and a second winding 520 that is symmetrically adjacent to first winding 510 that are disposed, for example, on a substrate 517. In various embodiments, first winding 510 and second winding 520 have closely matched and/or identical geometries. First winding 510 includes winding terminals 512 and 514 on one side of the first winding and a center tap terminal 516 on the other side of the first winding. Similarly, second winding 520 includes winding terminals 522 and 524 on one side of the second winding and a center tap terminal 526 on the other side of the second winding. These two windings are arranged so such that center tap terminal 526 of the second winding is disposed between winding terminals 512 and 514 of the first winding, and center tap terminal 516 of the first winding is disposed between winding terminals 522 and 524 of the second winding.

Each winding has a respective cross-under portion: the first winding crosses under the second winding via cross-under portion 518 and the second winding crosses under the first winding via cross-under portion 528, such that the main portion of the winding is on a first conductive layer, and the cross-under portion is on a second conductive layer. Alternatively, cross-under portions 518 and 528 may be a cross-over portion. As shown, cross-under portions 518 and 528 are disposed symmetrically opposite each other in the layout of transformers 406 and 426. These conductive layers may be metallization layers made of copper, aluminum, or other conductive materials used, for example, in the fabrication of semiconductor circuits. Such metallization layers may be fabricated during the back end of line (BEOL) processing of the semiconductor circuit. Alternatively, the metallization layers may be fabricated on a redistribution layer RDL in a package after the integrated circuit has been fabricated. Substrate 517 may be a semiconductor substrate such as a silicon substrate or may be another type of substrate including by not limited to an insulating substrate, a ceramic substrate or molded substrate, depending on the particular fabrication technology used. It should be understood that symmetrical transformer 500 is just one example of many possible embodiment symmetrical transformers. In alternative embodiments of the present invention, symmetrical transformers may be implemented shapes and sizes that are different from what is illustrated in FIG. 5A.

FIG. 5A shows a layout of an integrated symmetrical transformer 550 that may be used to implement transformers 406 and 426 having a 1:1 turns ratio. As shown, transformer 550 includes a first winding connected between terminals 554 and 556, and a second winding connected between terminals 570 and 574. The first winding includes portions 552 and 560 that are implemented using the first conductive layer, and a second portion 562 that crosses under first portion 552 and joins first portions 552 and 560 that is implemented using a second conductive layer. Center tap terminal 558 is disposed between terminals 554 and 556 and contacts portion 560 of the first winding.

Figure 5B:
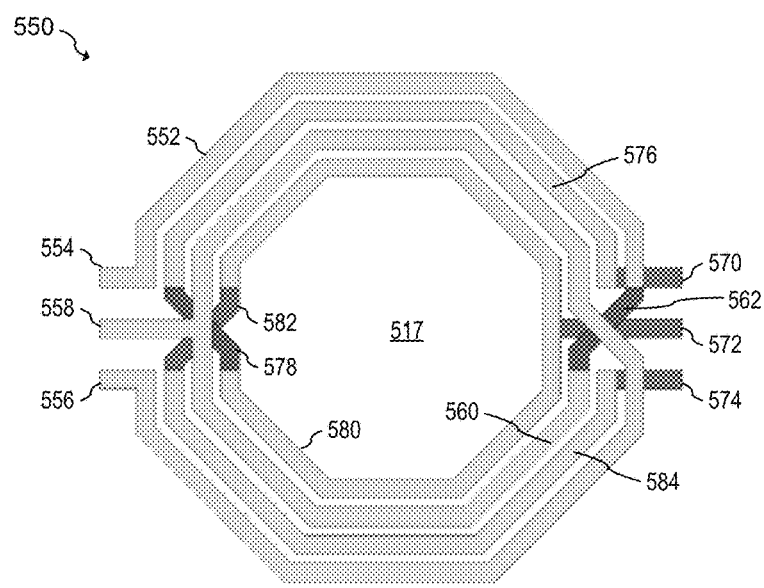

Transformer 550 also includes a second winding having portions 576, 580 and 584 on the first conductive layer. Portions 576 and 584 are connected via portion 582 on the third conductive layer and portions 576 and 580 are connected via portion 578 on the second conductive layer. End terminals 570 and 574 the second winding are connected to respective portions 576 and 584 via the third conductive layer, and center tap terminal 572 is connected to portion 580 via the third conductive layer. As shown in FIG. 5B, the third conductive layer is below the second conductive layer and disposed over substrate 517, and the second conductive layer is below the first conductive layer. In alternative embodiments of the present invention, the ordering of the first, second and third conductive layers may be different. It should also be appreciated that transformers 500 and 550 shown in FIGS. 5A and 5B are two examples of many possible embodiment implementations of transformers that can be used with embodiment VCOs disclosed herein.

Figure 5C:
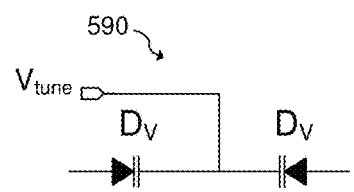
FIG. 5C illustrates a schematic of an embodiment varactor.

FIG. 5C illustrates an embodiment varactor circuit 590 that may be used to implement tunable capacitances, such as variable capacitors $C_1$ and $C_2$ of the various disclosed embodiment VCOs. As shown, varactor circuit 590 includes a pair of series connected varactor diodes $D_V$. In various embodiments, the capacitance of varactor diodes $D_V$ may be adjusted by varying the voltage of $V_{tune}$ applied to the cathodes of varactor diodes $D_V$. As the voltage $V_{tune}$ is increased, the capacitance of varactor diodes $D_V$ decreases due to the increased width of the depletion regions of the junctions of diodes $D_V$. This decrease in capacitance causes a corresponding increase in the resonant frequency of the VCO tank. Likewise, as the voltage $V_{tune}$ is decreased, the capacitance of varactor diodes $D_V$ increase due to the decreased width of the depletion regions of the junctions of diodes $D_V$. This increase in capacitance causes a corresponding decrease in the resonant frequency of the VCO tank. In alternative embodiments, the polarity of varactor diodes $D_V$ may be reversed such that the resonant frequency of the VCO tank decreases with increasing voltage.

Figure 6A:
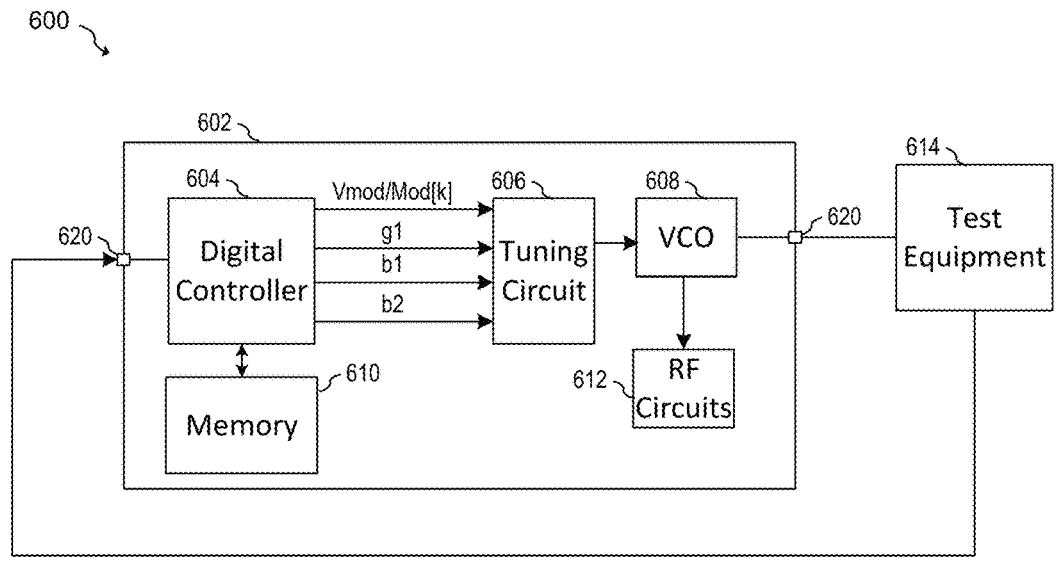
FIG. 6A illustrates a system for calibrating the phase noise of an embodiment VCO.

FIG. 6A illustrates a system 600 for calibrating an RFIC 602 that include VCO 608 according to the various embodiments disclosed herein. RFIC also includes an embodiment tuning circuit 606, as described with respect to embodiments described herein, and a digital controller that controls the frequency of oscillation of VCO 608 via VCO control signal Vmod/Mod[k], and provides calibration values g1, b1, and b2. Signal Vmod/Mod[k] can either be a k-bit digital signal or an analog signal produced by a DAC within digital controller 604. Memory 610 may be used to store calibration values g1, b1, and b2. RF circuits 612 that are coupled to VCO 608 may be configured to provide an RF function, such as a gesture recognition radar, an automotive radar, or other RF function.

Digital controller 604 is coupled to interface pin 620 and may contain a digital interface through which external digital circuits may communication with RFIC 602. The digital interface may be a serial or parallel interface and may communication with using communications protocols such as $I^2C$, SPI, or other protocols. Digital controller 604 may be implemented, for example, using a microcontroller, a microprocessor, programmable logic, custom logic, or any other type of logic known in the art that can implement embodiment tuning and control methods. In some embodiments, digital controller 604 utilizes a processor that executes instructions that carry out embodiment tuning and control methods.

Memory 610 may be used to store executable code for use by digital controller 604, and may also be used to store calibration constants g1, b1, and b2. In some embodiments, memory 610 includes a table of values for g1, b1, and b2 that may be selected according to the particular value of VCO control signal Vmod/Mod[k] being applied to VCO 608. This functionality may be implemented, for example, using a lookup table.

In an embodiment, test equipment 614 may be used to calibrate the phase noise performance of VCO 608 by determining values for g1, b2 and b2 that provide low or minimum amounts of phase noise generated by VCO 608. Test equipment may include, for example, a phase noise measurement device, such as a spectrum analyzer, that can be used to measure the phase noise produced by VCO 608. During calibration, test equipment 614 selects values for VCO tuning signal Vmod/Mod[k] and calibration values g1, b1, and b2 via the digital interface of digital controller 604. For a given value of VCO tuning signal Vmod/Mod[k], test equipment determines a set of calibration values g1, b1, and b2 that reduce or minimize the measured phase noise of VCO 608. In embodiments in which g1 is a gain applied to VCO tuning signal Vmod/Mod[k] prior to the tunable current source, b1 is an offset applied to the VCO tuning signal Vmod/Mod[k] prior to the tunable resonator of the VCO, and b2 is an offset applied prior to the tunable current source.

Figure 6B:
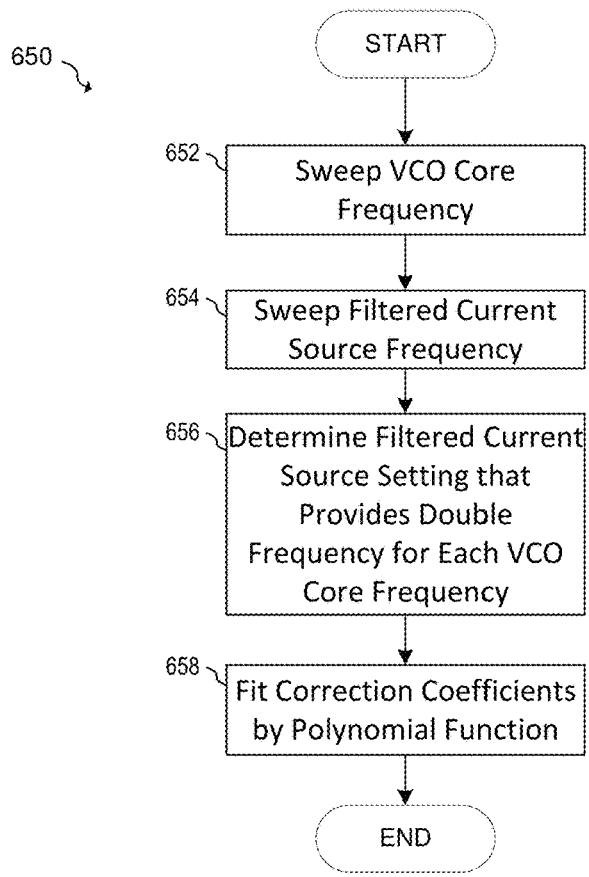
FIG. 6B illustrates a block diagram of a method for calibrating an embodiment VCO.

FIG. 6B illustrates a block diagram of a method 650 for calibrating an embodiment VCO. In step 652 the VCO core frequency is swept, and in step 654, the resonant frequency of the filtered current source is swept. The frequencies of the VCO core and filtered current source may be swept, for example, by sweeping an applicable tuning voltage and/or applicable tuning settings associated with the particular VCO core or filtered tuning source. Steps 652 and 654 may be performed sequentially and/or simultaneously. For example, in some embodiments, the frequency of the VCO core may be held steady while the frequency of the tunable current source is swept, while in other embodiments, the frequency of the tunable current source may be held steady as the frequency of the VCO tank is swept. During these sweeps, test equipment 614 measures the phase noise of VCO 608.

In step 656, filtered current source settings that provide a double frequency are determined for one or more VCO core frequency settings based on the phase noise measurements made by test equipment 614. In some embodiments this is accomplished by finding a filtered current source setting corresponding to a minimum measured phase noise for each VCO core frequency setting. In step 658, calibration values g1, b1, and b2 are determined by determining a fit using a polynomial function.

Figure 7:
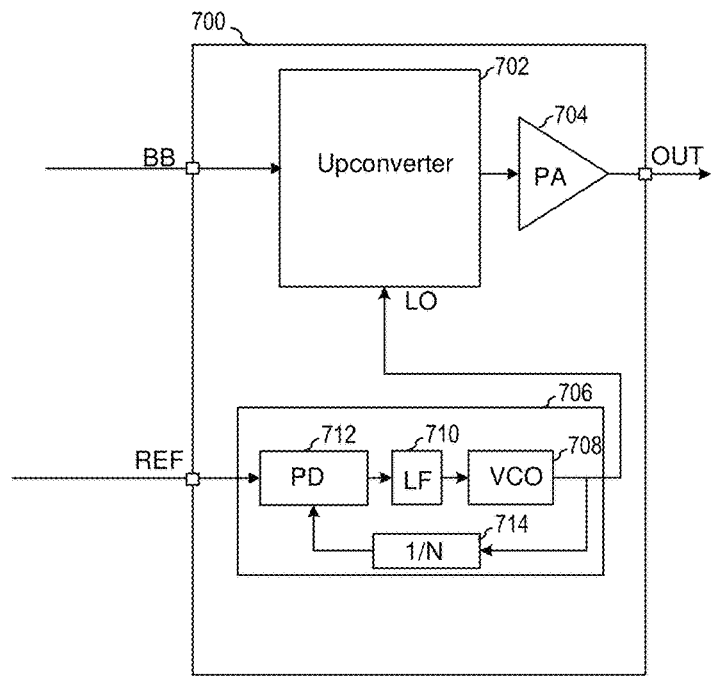
FIG. 7 illustrates a single-chip radar transmitter system that utilizes an embodiment VCO.

FIG. 7 illustrates single-chip radar transmitter system 700 that includes upconverter 702, power amplifier 704 and frequency generation circuit 706. As shown, upconverter 702 upconverts baseband signal BB to a higher frequency signal, which is then amplified by power amplifier 704 and output on pin OUT. In some embodiments, baseband signal BB may be a swept frequency or other signal type used in a radar system. Frequency generation circuit 706 produces local oscillator signal LO based on a reference frequency on pin REF that may be generated using, for example, a crystal oscillator. In an embodiment, frequency generation circuit 706 is implemented using a phase locked loop (PLL) having phase detector 712, loop filter 710, VCO 708 and divider 714. VCO 708 may be implemented using embodiment VCOs described herein. In some embodiments, the function of phase detector 712, loop filter 710 may be performed digitally using digital circuits and systems known in the art, as well as using analog circuitry. For example, these functions may be implemented using custom digital logic, standard cell digital logic, and/or may be implemented in software running on a processor, microcontroller or digital signal processor. Such processors may include, for example, a processor core, and memory coupled to the processor core and one or more input/output ports. Alternatively, other circuits and systems known in the art may be used to implement these functions. It should be appreciated that system 700 is just one of many examples of embodiment systems that may utilize embodiment oscillators. Alternative systems may include, for example, wireless and wire line communication systems, and other systems that use VCOs.

Figure 8:
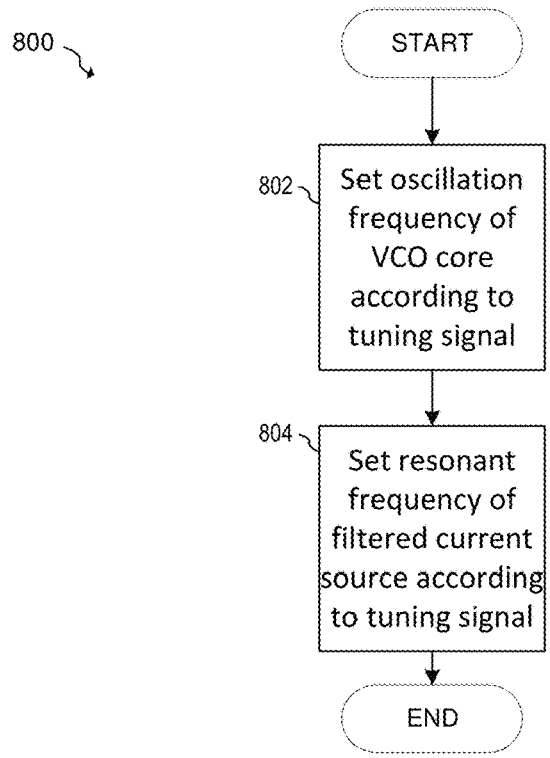
FIG. 8 illustrates a block diagram of an embodiment method of operating an embodiment VCO.

FIG. 8 illustrates a block diagram of a method of operation 800 of an embodiment VCO that may be applied to the various embodiment VCOs described herein that include a VCO core coupled to a filtered current source. For example, method of operation 800 may be applied to the embodiment VCOs of FIGS. 3A-3E and 4A-4D, as well as to the disclosed various systems that utilize embodiments VCOs. In step 802, the oscillation frequency of a VCO core is set according to a tuning signal received at a tuning signal input. In step 804, the resonant frequency of the filtered current source is set based on the received tuning signal. In some embodiments, a tuning circuit is used to set the resonant frequency of the filtered current source, and tuning circuit includes an input directly connected to the tuning signal input. It should be understood that in some embodiments, steps 802 and 804 may be executed in the order shown in FIG. 8, in a different order than what is shown in FIG. 8. Alternatively, steps 802 and 804 may be performed simultaneously.

Example embodiments of the present invention are summarized here. Other embodiments can also be understood from the entirety of the specification and the claims filed herein.

Example 1

A method of operating a voltage controlled oscillator (VCO) having a VCO core coupled to a filtered current source, includes: setting an oscillation frequency of the VCO core based on a tuning signal received at a tuning signal input; and setting a resonant frequency of the filtered current source based on the received tuning signal using a tuning circuit having an input directly connected to the tuning signal input.

Example 2

The method of example 1, where the filtered current source includes a current source, and tunable filter coupled between the VCO core and the current source.

Example 3

The method of example 2, where the tunable filter includes a parallel resonant LC circuit, and setting the resonant frequency of the filtered current source includes adjusting a capacitance of the parallel resonant LC circuit.

Example 4

The method of example 2, where: the tunable filter includes a variable capacitor and a transformer having a first winding coupled to the variable capacitor and a second winding coupled to the VCO core; and setting the resonant frequency of the filtered current source includes adjusting a capacitance of variable capacitor.

Example 5

The method of example 4, where the transformer is a symmetrical transformer.

Example 6

The method of one of examples 4 and 5, where the current source is coupled in series with the second winding.

Example 7

The method of one of examples 4-6 where the variable capacitor is coupled in parallel with the first winding.

Example 8

The method of one of example 4-6, where the variable capacitor is coupled in parallel with a first inductor to form a first parallel circuit, and the first parallel circuit is coupled in series with the first winding.

Example 9

The method of one of examples 2-9, where setting the resonant frequency of the filtered current source comprises multiplying the tuning signal by a first factor to form a first multiplied signal.

Example 10

The method of example 9, where setting the resonant frequency of the filtered current source comprises amplifying the tuning signal and applying the amplified tuning signal to the tunable filter.

Example 11

The method of example 10, where setting the resonant frequency of the filtered current source further includes adding a first offset to the multiplied first factor.

Example 12

The method of example 11, where setting the oscillation frequency of the VCO core includes adding a second offset to the tuning signal.

Example 13

The method of one of examples 1-12, where the tuning signal includes a digital signal.

Example 14

The method of example 13, where: setting the oscillation frequency of the VCO core includes performing a first digital to analog conversion of the tuning signal; and setting the resonant frequency of the filtered current source includes performing a second digital to analog conversion of the tuning signal.

Example 15

The method of example 14, where setting the resonant frequency of the filtered current source includes multiplying the tuning signal by a first gain prior to performing the second digital to analog conversion.

Example 16

The method of one of examples 1-15, where the tuning signal includes a frequency chirp.

Example 17

The method of one of examples 1-16, further including calibrating the VCO, where calibrating the VCO includes setting the oscillation frequency of the VCO core to a plurality of frequency settings; and determining a corresponding plurality of settings for the filtered current source corresponding to each of the plurality of frequency settings, wherein each of the corresponding plurality of settings for the filtered current source provides a resonant frequency that is double the oscillation frequency of the VCO core or provides a minimum phase noise of the VCO.

Example 18

The method of example 17, further including determining a set of calibration values based on the plurality of frequency settings and the corresponding plurality of settings for the filtered current source, wherein the calibration values represent adjustable circuit parameters of the VCO or the tunable current source.

Example 19

The method of example 18, wherein determining a set of calibration values includes determining a fit using a polynomial function.

Example 19

A voltage controlled oscillator (VCO) including: a VCO core; a filtered current source coupled to the VCO core; and a tuning circuit directly connected to a tuning signal input, the tuning circuit configured to set an oscillation frequency of the VCO core based on a tuning signal received at the tuning signal input, and set a resonant frequency of the filtered current source based on the tuning signal.

Example 20

The VCO of example 19, where the filtered current source includes a first current source, and a tunable filter coupled between the VCO core and the first current source.

Example 21

The VCO of example 20, where the tunable filter includes a parallel resonant LC circuit, and the tuning circuit is configured to set the resonant frequency of the filtered current source by adjusting a capacitance of the parallel resonant LC circuit.

Example 22

The VCO of example 20, where: the tunable filter includes a variable capacitor, and a transformer having a first winding coupled to the variable capacitor, and a second winding coupled to the VCO core; and the tuning circuit is configured to set the resonant frequency of the filtered current source by adjusting a capacitance of the variable capacitor.

Example 23

The VCO of example 22, where the transformer is a symmetrical transformer.

Example 24

The VCO of one of examples 20-23, where the first current source is coupled in series with the second winding.

Example 25

The VCO of example 22, wherein the variable capacitor is coupled in parallel with the first winding.

Example 26

The VCO of example 22, where the variable capacitor is coupled in parallel with a first inductor to form a first parallel circuit, and the first parallel circuit is coupled in series with the first winding.

Example 27

The VCO of one of examples 19-26, wherein the tuning circuit includes a multiplier coupled between the tuning signal input and the filtered current source.

Example 28

The VCO of example 27, wherein the multiplier comprises an amplifier coupled between the tuning signal input and the filtered current source.

Example 29

The VCO of one of examples 27 or 28, further including a first summing circuit configured to add a first offset to an output of the multiplier.

Example 30

The VCO of example 29, further including a second summing circuit configured to add a second offset to the tuning signal.

Example 31

The VCO of one of examples 19-30, where the tuning signal includes a digital signal.

Example 32

The VCO of example 31, further including: a first digital to analog converter coupled between the tuning signal input and the VCO core; and a second digital to analog converter coupled between the tuning signal input and the filtered current source.

Example 33

The VCO of example 32, further including a multiplier coupled between the tuning signal input and an input of the second digital to analog converter.

Example 34

An integrated circuit including: a semiconductor substrate; a voltage controlled oscillator (VCO) core disposed on the semiconductor substrate, the VCO core including a first transistor, a second transistor, and a first tunable resonator coupled between the first transistor and the second transistor; a filtered current source disposed on the semiconductor substrate, the filtered current source including a tunable filter coupled to the first transistor and the second transistor of the VCO core and a current source coupled to the tunable filter wherein the tunable filter comprises a resonant circuit; and a turning circuit having a tuning input, the tuning circuit configured to provide a VCO tuning signal to the first tunable resonator based on a tuning signal at the tuning input, and to provide a filtered current source tuning signal to the tunable filter based on the tuning signal at the tuning input.

Example 35

The integrated circuit of example 34, where: the tuning signal includes a digital signal; and the tuning circuit includes a first digital to analog converter coupled between the tuning input and the first tunable resonator, and a second digital to analog converter coupled between the tuning input and the tunable filter.

Example 36

The integrated circuit of example 34, where the tuning circuit includes an amplifier coupled between the tuning input and the tunable filter.

Example 37

The integrated circuit of one of examples 34-36, where the first tunable resonator comprises a first varactor coupled to a first inductor.

Example 38

The integrated circuit of one of examples 34-37, where the tunable filter includes a second varactor and a transformer disposed on the semiconductor substrate, where the second varactor is coupled in parallel with a first winding of the transformer, and a second winding of the transformer has a first end coupled to the current source and a second end coupled to the first transistor and the second transistor.

Example 39

The integrated circuit of example 38, where the transformer includes a symmetrical transformer.

Example 40

The integrated circuit of one of examples 34-37, where the tunable filter includes: a varactor coupled in parallel with an inductor; and a transformer comprising a first winding coupled in series with the LC tank and a second winding having a first end coupled to the current source and a second end coupled to the first transistor and the second transistor.

Example 41

The integrated circuit of one of examples 34-40, where the first transistor and the second transistor are MOS transistors.

Example 42

An integrated circuit including: a semiconductor substrate; a voltage controlled oscillator (VCO) disposed on the semiconductor substrate, the VCO including a cross-coupled transistor pair, a first tunable resonator coupled to the cross-coupled transistor pair, a current source coupled to the cross-coupled transistor pair, and a second tunable resonator coupled between the cross-coupled transistor pair and the current source; and a tuning circuit including a tuning input, a first tuning output coupled to a first tuning input of the first tunable resonator, and a second tuning output coupled a second tuning input of the second tunable resonator.

Example 43

The integrated circuit of example 42, where the tuning input is configured to receive a digital signal; and the tuning circuit includes a first digital to analog converter coupled between the tuning input and the first tuning output, and a second digital to analog converter coupled between the tuning input and the second tuning output.

Example 44

The integrated circuit of one of examples 42 or 43, where the tuning circuit includes an amplifier coupled between the tuning input and the second tuning output; the first tunable resonator includes a first varactor coupled to a first inductor; and the second tunable resonator includes a second varactor and a transformer disposed on the semiconductor substrate, where the second varactor is coupled in parallel with a first winding of the transformer, and a second winding of the transformer has a first end coupled to the current source and a second end coupled to the cross-coupled transistor pair.

Example 45

The integrated circuit of one of examples 43 or 44, where the second tunable resonator includes: a varactor coupled in parallel with an inductor; and a transformer that includes a first winding coupled in series with an LC tank and a second winding having a first end coupled to the current source and a second end coupled to the cross-coupled transistor pair.

Advantages of embodiments include the ability for a single RF VCO to produce a low phase noise signal over a large range of output frequencies. A further advantage includes the ability to produce a swept VCO signal having low phase noise as minimum and maximum output frequencies, as well as at swept frequencies between the minimum and maximum output frequencies.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a voltage controlled oscillator (VCO) comprising a VCO core coupled to a filtered current source, wherein the filtered current source comprises a current source, and a tunable filter coupled between the VCO core and the current source, the method comprising:
   setting an oscillation frequency of the VCO core based on a tuning signal received at a tuning signal input; and
   setting a resonant frequency of the filtered current source based on the received tuning signal using a tuning circuit having an input directly connected to the tuning signal input.

2. The method of claim 1, wherein the tunable filter comprises a parallel resonant LC circuit, and setting the resonant frequency of the filtered current source comprises adjusting a capacitance of the parallel resonant LC circuit.

3. The method of claim 1, wherein setting the resonant frequency of the filtered current source comprises multiplying the tuning signal by a first factor to form a first multiplied signal.

4. The method of claim 3, wherein setting the resonant frequency of the filtered current source comprises amplifying the tuning signal and applying the amplified tuning signal to the tunable filter.

5. The method of claim 3, wherein
setting the resonant frequency of the filtered current source further comprises adding a first offset to the first multiplied factor; and
setting the oscillation frequency of the VCO core comprises adding a second offset to the tuning signal.

6. The method of claim 1, wherein the tuning signal comprises a frequency chirp.

7. The method of claim 1, further comprising calibrating the VCO, wherein calibrating the VCO comprises:
setting the oscillation frequency of the VCO core to a plurality of frequency settings; and
determining a corresponding plurality of settings for the filtered current source corresponding to each of the plurality of frequency settings, wherein each of the corresponding plurality of settings for the filtered current source sets the resonant frequency to double the oscillation frequency of the VCO core or provides a minimum phase noise of the VCO.

8. The method of claim 7, further comprising determining a set of calibration values based on the plurality of frequency settings and the corresponding plurality of settings for the filtered current source, wherein the calibration values represent adjustable circuit parameters of the VCO or the filtered current source.

9. A voltage controlled oscillator (VCO) comprising:
a VCO core;
a filtered current source coupled to the VCO core, wherein the filtered current source comprises a first current source, and a tunable filter coupled between the VCO core and the first current source; and
a tuning circuit directly connected to a tuning signal input, the tuning circuit configured to
set an oscillation frequency of the VCO core based on a tuning signal received at the tuning signal input, and
set a resonant frequency of the filtered current source based on the tuning signal.

10. The VCO of claim 7, wherein the tunable filter comprises a parallel resonant LC circuit, and the tuning circuit is configured to set the resonant frequency of the filtered current source by adjusting a capacitance of the parallel resonant LC circuit.

11. The VCO of claim 7, wherein:
the tunable filter comprises
a variable capacitor, and
a transformer having a first winding coupled to the variable capacitor, and a second winding coupled to the VCO core; and
the tuning circuit is configured to set the resonant frequency of the filtered current source by adjusting a capacitance of the variable capacitor.

12. The VCO of claim 11, wherein the first current source is coupled in series with the second winding.

13. The VCO of claim 11, wherein the variable capacitor is coupled in parallel with the first winding.

14. The VCO of claim 11, wherein the variable capacitor is coupled in parallel with a first inductor to form a first parallel circuit, and the first parallel circuit is coupled in series with the first winding.

15. The VCO of claim 7, wherein:
the tuning circuit comprises a multiplier coupled between the tuning signal input and the filtered current source;
the multiplier comprises an amplifier coupled between the tuning signal input and the filtered current source; and
the VCO further comprises
a first summing circuit configured to add a first offset to an output of the multiplier, and
a second summing circuit configured to add a second offset to the tuning signal.

16. The VCO of claim 9, further comprising:
a first digital to analog converter coupled between the tuning signal input and the VCO core; and
a second digital to analog to converter coupled between the tuning signal input and the filtered current source, wherein the tuning signal comprises a digital signal.

17. An integrated circuit comprising:
a semiconductor substrate;
a voltage controlled oscillator (VCO) disposed on the semiconductor substrate, the VCO comprising a cross-coupled transistor pair, a first tunable resonator coupled to the cross-coupled transistor pair, a current source coupled to the cross-coupled transistor pair, and a second tunable resonator coupled between the cross-coupled transistor pair and the current source;
a tuning circuit comprising a tuning input, a first tuning output coupled to a first tuning input of the first tunable resonator, and a second tuning output coupled a second tuning input of the second tunable resonator.

18. The integrated circuit of claim 17, wherein:
the tuning input is configured to receive a digital signal; and
the tuning circuit comprises a first digital to analog converter coupled between the tuning input and the first tuning output, and a second digital to analog converter coupled between the tuning input and the second tuning output.

19. The integrated circuit of claim 17, wherein
the tuning circuit comprises an amplifier coupled between the tuning input and the second tuning output;
the first tunable resonator comprises a first varactor coupled to a first inductor; and
the second tunable resonator comprises a second varactor and a transformer disposed on the semiconductor substrate, wherein the second varactor is coupled in parallel with a first winding of the transformer, and a second winding of the transformer has a first end coupled to the current source and a second end coupled to the cross-coupled transistor pair.

20. The integrated circuit of claim 17, wherein the second tunable resonator comprises:
a varactor coupled in parallel with an inductor; and
a transformer comprising a first winding coupled in series with an LC tank and a second winding having a first end coupled to the current source and a second end coupled to the cross-coupled transistor pair.

* * * * *